(12) United States Patent
Asai et al.

(10) Patent No.: US 11,233,131 B2
(45) Date of Patent: Jan. 25, 2022

(54) TUNNEL FIELD-EFFECT TRANSISTOR AND METHOD FOR DESIGNING SAME

(71) Applicant: NATIONAL INSTITUTE OF ADVANCED INDUSTRIAL SCIENCE AND TECHNOLOGY, Tokyo (JP)

(72) Inventors: Hidehiro Asai, Ibaraki (JP); Takahiro Mori, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 16/982,924

(22) PCT Filed: Mar. 22, 2019

(86) PCT No.: PCT/JP2019/011990
§ 371 (c)(1),
(2) Date: Sep. 21, 2020

(87) PCT Pub. No.: WO2019/182086
PCT Pub. Date: Sep. 26, 2019

(65) Prior Publication Data
US 2021/0013316 A1    Jan. 14, 2021

(30) Foreign Application Priority Data
Mar. 22, 2018 (JP) .............................. JP2018-054081

(51) Int. Cl.
*H01L 29/423* (2006.01)
*H01L 29/786* (2006.01)
(Continued)

(52) U.S. Cl.
CPC .. *H01L 29/42384* (2013.01); *H01L 29/42392* (2013.01); *H01L 29/66977* (2013.01);
(Continued)

(58) Field of Classification Search
CPC ......... H01L 29/42384; H01L 29/42392; H01L 29/66977; H01L 29/78648; H01L 29/78696; H01L 29/0847; H01L 29/78642
(Continued)

(56) References Cited

U.S. PATENT DOCUMENTS

| 5,198,379 A | 3/1993 | Adan |
| 2008/0224224 A1* | 9/2008 | Vandenderghe .... H01L 29/0673 257/365 |

FOREIGN PATENT DOCUMENTS

| JP | H04-010660 A | 1/1992 |
| JP | 2008-252086 A | 10/2008 |

(Continued)

OTHER PUBLICATIONS

Asai et al., "TCAD Simulation of C-TFET Circuit with Drain Offset Structure," IEICE Technical Report, Jul. 2017, pp. 21-24, vol. 117, No. 116, SDM2017-35, The Institute of Electronics, Information and Communication Engineers (IEICE), Japan.
(Continued)

*Primary Examiner* — Tong-Ho Kim
(74) *Attorney, Agent, or Firm* — Michael Best & Friedrich LLP

(57) ABSTRACT

[Problem] To improve the drain current ON/OFF ratio characteristics.
[Solution] A tunnel field-effect transistor 10 of the present invention is such that, when the gate length is denoted by $L_G$ and the extension distance of a source region 1 extended toward a drain region 3 from a position in the source region 1 is denoted by $L_{OV}$, $L_{TG}$ expressed in Formula (1) below as
(Continued)

the shortest distance between the position of an extension end of the source region 1 based on a drain-side reference position as the side face position of a gate electrode 6a, 6b closest to the drain region 3, and the position in the semiconductor layer 4 opposite to the drain-side reference position in the height direction of the gate electrode 6a, 6b satisfies a condition of Inequality (2) below. Note that $l_{t\_OFF}$ in Inequality (2) denotes a shortest tunnel distance over which carriers move from the source region to a channel region through a tunnel junction surface in an OFF state of the tunnel field-effect transistor.

8 Claims, 14 Drawing Sheets

(51) Int. Cl.
    *H01L 29/66*     (2006.01)
    *H01L 29/08*     (2006.01)
(52) U.S. Cl.
    CPC .. *H01L 29/78648* (2013.01); *H01L 29/78696* (2013.01); *H01L 29/0847* (2013.01); *H01L 29/78642* (2013.01)

(58) Field of Classification Search
    USPC ......................................................... 257/105
    See application file for complete search history.

(56) References Cited

FOREIGN PATENT DOCUMENTS

| | | |
|---|---|---|
| JP | 2016-004873 A | 1/2016 |
| WO | WO-2014/162624 A1 | 10/2014 |

OTHER PUBLICATIONS

Boucart et al., "Double-Gate Tunnel FET With High-k Gate Dielectric," IEEE Transactions on Electron Devices, Jul. 2007, pp. 1725-1733, vol. 54, No. 7, DOI: 10.1109/TED.2007.899389, IEEE.

Verhulst et al., "Tunnel field-effect transistor without gate-drain overlap," Applied Physics Letters, 2007, vol. 91, Issue 5, DOI: 10.1063/1.2757593, American Institute of Physics, AIP Publishing LLC.

International Search Report issued in Application No. PCT/JP2019/011990, dated Jun. 11, 2019.

* cited by examiner

TUNNEL FIELD-EFFECT TRANSISTOR AND METHOD FOR DESIGNING SAME

TECHNICAL FIELD

The present invention relates to a tunnel field-effect transistor using tunneling and a method for designing the same.

BACKGROUND ART

Recently, attempts to achieve the low power consumption of LSI have been actively made. A reduction in operating voltage is one of the attempts, but it is difficult for a MOS transistor used in conventional circuits to reduce voltage significantly because of physical limitations.

For example, as illustrated in the transistor transfer characteristics of FIG. 1, the rise of an ON current, that is, a steep rise to make an s value (subthreshold value) equal to or less than 60 mV/decade cannot be achieved in the transfer characteristics of the MOS transistor mentioned above. In FIG. 1, the abscissa indicates gate voltage and the ordinate indicates drain current in logarithmic scale.

Therefore, the development of a low-voltage switching device based on an operating principle different from that of the above MOS transistor has been long awaited to achieve the low power consumption of LSI.

A tunnel field-effect transistor using semiconductor band-to-band tunneling is one of the solutions. Since the tunnel field-effect transistor uses the tunneling effect principle different from that of the MOS transistor, the tunnel field-effect transistor can obtain a steep rise to make the rise of the ON current equal to or less than 60 mV/decade as illustrated in FIG. 1, and hence can realize a reduction in power-supply voltage effectively.

Here, the schematic structure of a conventional tunnel field-effect transistor will be described with reference to FIG. 2. This tunnel field-effect transistor 100 includes a semiconductor layer 104 in which a source region 101, a channel region 102, and a drain region 103 are formed, a first gate part formed with a gate insulating film 105a and a gate electrode 106a formed in this order on the top surface of the semiconductor layer 104, a first insulating film 107a arranged to cover the side of the gate electrode 106a, a second gate part formed with a gate insulating film 105b and a gate electrode 106b arranged in this order under the bottom surface of the semiconductor layer 104 to face the first gate part across the semiconductor layer 104, and a second insulating film 107b arranged to cover the second gate electrode 106b, thus having a double-gate structure of the first gate part and the second gate part, and a drain offset structure in which the drain region 103 is kept away from the gate electrodes 106a and 106b.

In the tunnel field-effect transistor 100 thus structured, when a gate voltage is applied from the gate electrodes 106a and 106b, tunneling occurs in which carriers in the source region 101 pass through a tunnel junction surface as a boundary surface between the source region 101 and the channel region 102 (see the arrows in FIG. 2), and hence a drain current can be generated (for example, see Non-Patent Document 1 as for a tunnel field-effect transistor having the double-gate structure. Further, see Non-Patent Document 2 as for a tunnel field-effect transistor having the drain offset structure).

Thus, in the tunnel field-effect transistor 100, the gate voltage is controlled based on the tunneling to make the transistor operation possible. Further, since steep switching can be achieved with a low gate voltage, low power consumption of LSI can be expected.

However, the steep switching in the tunnel field-effect transistor 100 can be achieved only in an ultra-low voltage and low current region. When the gate voltage is increased from the ultra-low voltage region, the steepness is immediately lost.

As a result, in the tunnel field-effect transistor 100, an ON/OFF ratio superior to the ON/OFF ratio of the drain current of the MOS transistor can be obtained only in an ultra-low voltage region in which the gate voltage is about 0.1 V or less.

Since the operation in the ultra-low voltage region causes a problem that the deterioration of the yield due to variation in threshold voltage becomes serious, the tunnel field-effect transistor 100 is required to realize the ON/OFF ratio, superior to the ON/OFF ratio of the drain current of the MOS transistor, with a gate voltage in a low voltage region of 0.3 V to 0.5 V (absolute value) as a scope of low voltage operation.

Here, although the description is made by taking, as an example, the double-gate type tunnel field-effect transistor 100, other types of tunnel field-effect transistors have similar problems.

PRIOR ART DOCUMENTS

Non-Patent Documents

Non-Patent Document 1: K. Boucart et al., IEEE Transaction on Electron Devices 54,1725 (2007)
Non-Patent Document 2: A. S. Verhulst et al., Appl. Phys. Lett. 91, 053102 (2007)

DISCLOSURE OF THE INVENTION

Problems to be Solved by the Invention

The present invention has been made to solve the various conventional problems and achieve the following object: Namely, it is an object of the present invention to provide a tunnel field-effect transistor which contributes to an improvement in the drain current ON/OFF ratio characteristics, and a method for designing the same.

In order to solve the problems, the present inventors have made intensive studies, and the following findings have been established.

In the conventional tunnel field-effect transistor 100 (see FIG. 2), an extension end of the source region 101 extending toward the side of the drain region 103 is so set that the distance to the side faces (left side faces in the figure) of the gate electrodes 106a and 106b on the side of the source region 101 is shorter than the distance to the side faces (right side faces in the figure) of the gate electrodes 106a and 106b on the side of the drain region 103. Namely, the part of the channel region 102 controlled by the gate parts is wide and hence a long tunnel path through which the carriers tunnel can appear in the channel region 102.

To describe the drain current-gate voltage characteristics and the amount of carrier generation due to band-to-band tunneling in the tunnel field-effect transistor 100 thus set, it is confirmed that the drain current rises near a primary gate voltage (0.6 V as indicated at (a) in FIG. 3) in the drain current-gate voltage characteristics as illustrated in FIG. 3, and that the drain current becomes an ON state near a secondary gate voltage (1.4 V as indicated at (b) in FIG. 3) higher than the primary gate voltage. A spatial distribution of the amount of carrier generation due to band-to-band tunneling at the primary gate voltage is as illustrated in FIG. 4(a), and it is confirmed that a long tunnel path having a low tunnel rate is generated. Further, a spatial distribution of the amount of carrier generation due to band-to-band tunneling at the secondary gate voltage is as illustrated in FIG. 4(b), and it is confirmed that a short tunnel path having a high tunnel rate is generated.

Namely, in the tunnel field-effect transistor 100, a gentle drain current rise is exhibited by the long tunnel path having the low tunnel rate near the primary gate voltage, and the drain current becomes the ON state by the short tunnel path having the high tunnel rate near the secondary gate voltage.

Note that FIG. 3 is a graph illustrating the drain current-gate voltage characteristics of the tunnel field-effect transistor 100, FIG. 4(a) is a FIG. 1) illustrating the spatial distribution of the amount of carrier generation due to band-to-band tunneling at the primary gate voltage, and FIG. 4(b) is a FIG. 1) illustrating the spatial distribution of the amount of carrier generation due to band-to-band tunneling at the secondary gate voltage.

In contrast, when the extension end of the source region 101 extending toward the side of the drain region 103 of the tunnel field-effect transistor 100 (see FIG. 2) is put closer to the side faces (right side faces in the figure) of the gate electrodes 106a and 106b on the side of the drain region 103, the part of the channel region 102 controlled by the gate parts becomes narrower and hence no long tunnel path is generated.

Then, the tunnel path (long tunnel path) having the low tunnel rate and generated so far at the primary gate voltage disappears, and as the gate voltage increases toward the secondary gate voltage higher than the primary gate voltage, a tunnel path (short tunnel path) having a high tunnel rate suddenly appears, exhibiting a steep rise in drain current.

This state will be described with reference to FIG. 5, FIG. 6(a), and FIG. 6(b). Note that FIG. 5 is a graph illustrating the drain current-gate voltage characteristics of a modified tunnel field-effect transistor, FIG. 6(a) is a FIG. 2) illustrating a spatial distribution of the amount of carrier generation due to band-to-band tunneling at the primary gate voltage, and FIG. 6(b) is a FIG. 2) illustrating a spatial distribution of the amount of carrier generation due to band-to-band tunneling at the secondary gate voltage.

As illustrated in FIG. 5, no drain current rise is confirmed near the primary gate voltage (0.6 V as indicated at (a) in the figure), and as the gate voltage increases toward the secondary gate voltage higher than the primary gate voltage, such drain current-gate voltage characteristics as a steep rise is confirmed near a gate voltage of 1 V. This drain current rise is extremely steep compared with the drain current rise in the tunnel field-effect transistor 100 as indicated by the dotted line in FIG. 5, and the generation of OFF current can be significantly reduced.

The long tunnel path (see FIG. 4(a)) generated in the tunnel field-effect transistor 100 disappears at the primary gate voltage as illustrated in FIG. 6(a), and the generation of a short tunnel path having a high tunnel rate is confirmed at the secondary gate voltage as illustrated in FIG. 6(b).

This means that when the part of the channel region 102 controlled by the gate parts is made narrower, that is, when the extension end of the source region 101 is made to extend to a position near the side faces of the gate electrodes 106a and 106b on the side of the drain region 103, a steep rise in drain current by a short tunnel path having a high tunnel rate can be obtained without generating a long tunnel path having a low tunnel rate, and hence excellent drain current ON/OFF ratio characteristics can be obtained.

Means for Solving the Problems

The present invention has been made based on the findings, and means for solving the problems are as follows.

<1> A tunnel field-effect transistor including: a semiconductor layer formed to include a source region, a channel region arranged adjacent to the source region and whose boundary surface with the source region is set as a tunnel junction surface to cause carriers in the source region to tunnel through, and a drain region arranged adjacent to the channel region and to which the carriers are transported from the channel region; a gate part formed with a gate insulating film and a gate electrode arranged in this order on the semiconductor layer; and an insulation part arranged to cover a side face of the gate electrode, and having: a structure in which part of the source region is arranged under a bottom surface of the gate part as a surface on the side of the gate insulating film to cause the bottom surface and the part of the source region to come into contact with each other; and a drain offset structure in which a drain offset region is formed in the semiconductor layer to keep the gate electrode and the drain region away from each other, wherein when a gate length as the width of the gate electrode in a direction parallel to a channel direction between the source region and the drain region is denoted by $L_G$, and an extension distance of the source region extended toward the drain region in a direction parallel to the channel direction from a position in the source region opposite in the height direction of the gate electrode to a source-side reference position as a side face position of the gate electrode closest to the source region is denoted by $L_{OV}$, $L_{TG}$ expressed in Formula (1) below as a shortest distance between a position of an extension end of the source region, which is most extended toward the drain region based on a side face position of the gate electrode closest to the drain region and set as a drain-side reference position, and a position in the semiconductor layer opposite in the height direction of the gate electrode to the drain-side reference position satisfies respective conditions of Inequality (2) and Inequality (3) below,

[Math. 1]

$$L_{TG} = L_G - L_{OV} \tag{1}$$

[Math. 2]

$$L_{TG} < l_{t\_OFF} \tag{2}$$

[Math. 3]

$$L_{TG} > L_{direct} - L_{OFF} \tag{3}$$

where $l_{t\_OFF}$ in Inequality (2) denotes a shortest tunnel distance over which the carriers move from the source region to the channel region through the tunnel junction surface in an OFF state of the tunnel field-effect transistor, and in Inequality (3), $L_{direct}$ denotes a shortest distance between the source region and the drain region to regulate a direct tunnel through which the carriers move between the source region and the drain region by forming a tunnel path to connect the source region and the drain region, and $L_{OFF}$ denotes a drain offset length to regulate a length of the channel direction in the drain offset region.

<2> The tunnel field-effect transistor according to <1>, wherein $L_{TG}$ further satisfies a condition of Inequity (4) below,

[Math. 4]

$$L_{TG} > -T_{OX}\sqrt{\frac{4\epsilon_{SW}^2\beta^2}{\epsilon_{OX}^2} - 1} \quad (4)$$

where in Inequality (4), $T_{OX}$ denotes the thickness of the gate insulating film, $\epsilon_{OX}$ denotes the relative permittivity of a forming material of the gate insulating film, $\epsilon_{SW}$ denotes the relative permittivity of a forming material of the insulation part, and ß denotes an amplification factor of an electric field due to an electric field concentration at the position of the extension end of the source region.

<3> A tunnel field-effect transistor including: a semiconductor layer formed to include a source region, a channel region arranged adjacent to the source region and whose boundary surface with the source region is set as a tunnel junction surface to cause carriers in the source region to tunnel through, and a drain region arranged adjacent to the channel region and to which the carriers are transported from the channel region; a gate part formed with a gate insulating film and a gate electrode arranged in this order on the semiconductor layer; and an insulation part arranged to cover a side face of the gate electrode, and having: a structure in which part of the channel region and part of the source region with a support surface formed with respect to the part of the channel region as a surface parallel to a bottom surface of the gate part as a surface on the side of the gate insulating film are arranged in this order under the bottom surface to cause the part of the channel region to separate the bottom surface and the support surface from each other; and a drain offset structure in which a drain offset region is formed in the semiconductor layer to keep the gate electrode and the drain region away from each other, wherein when a gate length as the width of the gate electrode in a direction parallel to a channel direction between the source region and the drain region is denoted by $L_G$, and an extension distance of the source region extended toward the drain region in a direction parallel to the channel direction from a position in the source region opposite in the height direction of the gate electrode to a source-side reference position as a side face position of the gate electrode closest to the source region is denoted by $L_{OV}$, $L_{TG}$ expressed in Formula (1) below as a shortest distance between a position of an extension end of the source region, which is most extended toward the drain region based on a side face position of the gate electrode closest to the drain region and set as a drain-side reference position, and a position in the semiconductor layer opposite in the height direction of the gate electrode to the drain-side reference position satisfies respective conditions of Inequality (3) and Inequality (5) below,

[Math. 5]

$$L_{TG} = L_G - L_{OV} \quad (1)$$

[Math. 6]

$$L_{TG} > L_{direct} - L_{OFF} \quad (3)$$

[Math. 7]

$$L_{TG} < \sqrt{l_{t\_OFF}^2 - T_{EPI}^2} \quad (5)$$

where in Inequality (3), $L_{direct}$ denotes a shortest distance between the source region and the drain region to regulate a direct tunnel through which the carriers move between the source region and the drain region by forming a tunnel path to connect the source region and the drain region, and $L_{OFF}$ denotes a drain offset length to regulate a length of the channel direction in the drain offset region, and in Inequality (5), $l_{t\_OFF}$ denotes a shortest tunnel distance over which the carriers move from the source region to the channel region through the tunnel junction surface in an OFF state of the tunnel field-effect transistor, and $T_{EPI}$ denotes a shortest distance between the bottom surface and the support surface.

<4> The tunnel field-effect transistor according to any one of <1> to <3>, wherein a forming material of the semiconductor layer is either one of Si and Ge.

<5> The tunnel field-effect transistor according to any one of <1> to <4>, wherein the tunnel field-effect transistor has either a double-gate structure, in which gate parts are arranged in positions opposite to each other on a top surface and a bottom surface of the semiconductor layer, respectively, or an SOI structure in which the semiconductor layer and the gate part are arranged in this order on a silicon oxide film.

<6> A method for designing a tunnel field-effect transistor including: a semiconductor layer formed to include a source region, a channel region arranged adjacent to the source region and whose boundary surface with the source region is set as a tunnel junction surface to cause carriers in the source region to tunnel through, and a drain region arranged adjacent to the channel region and to which the carriers are transported from the channel region; a gate part formed with a gate insulating film and a gate electrode arranged in this order on the semiconductor layer; and an insulation part arranged to cover a side face of the gate electrode, and having; a structure in which part of the source region is arranged under a bottom surface of the gate part as a surface on the side of the gate insulating film to cause the bottom surface and the part of the source region to come into contact with each other; and a drain offset structure in which a drain offset region is formed in the semiconductor layer to keep the gate electrode and the drain region away from each other, wherein when a gate length as the width of the gate electrode in a direction parallel to a channel direction between the source region and the drain region is denoted by $L_G$, and an extension distance of the source region extended toward the drain region in a direction parallel to the channel direction from a position in the source region opposite in the height direction of the gate electrode to a source-side reference position as a side face position of the gate electrode closest to the source region is denoted by $L_{OV}$, the tunnel field-effect transistor is so designed that $L_{TG}$ expressed in Formula (1) below as a shortest distance between a position of an extension end of the source region, which is most extended toward the drain region based on a side face position of the gate electrode closest to the drain region and set as a drain-side reference position, and a position in the semiconductor layer opposite in the height direction of the gate electrode to the drain-side reference position satisfies respective conditions of Inequality (2) and Inequality (3) below,

[Math. 8]

$$L_{TG}=L_G-L_{OV} \quad (1)$$

[Math. 9]

$$L_{TG}<l_{t\_OFF} \quad (2)$$

[Math. 10]

$$L_{TG}>L_{direct}-L_{OFF} \quad (3)$$

where $l_{t\_OFF}$ in Inequality (2) denotes a shortest tunnel distance over which the carriers move from the source region to the channel region through the tunnel junction surface in an OFF state of the tunnel field-effect transistor, and in Inequality (3), $L_{direct}$ denotes a shortest distance between the source region and the drain region to regulate a direct tunnel through which the carriers move between the source region and the drain region by forming a tunnel path to connect the source region and the drain region, and $L_{OFF}$ denotes a drain offset length to regulate a length of the channel direction in the drain offset region.

<7> The method for designing the tunnel field-effect transistor according to <6>, wherein $L_{TG}$ further satisfies a condition of Inequity (4) below,

[Math. 11]

$$L_{TG} > -T_{OX}\sqrt{\frac{4\varepsilon_{SW}^2\beta^2}{\varepsilon_{OX}^2}-1} \quad (4)$$

where in Inequality (4), $T_{OX}$ denotes the thickness of the gate insulating film, $\varepsilon_{OX}$ denotes the relative permittivity of a forming material of the gate insulating film, $\varepsilon_{SW}$ denotes the relative permittivity of a forming material of the insulation part, and ß denotes an amplification factor of an electric field due to an electric field concentration at the position of the extension end of the source region.

<8> A method for designing a tunnel field-effect transistor including: a semiconductor layer formed to include a source region, a channel region arranged adjacent to the source region and whose boundary surface with the source region is set as a tunnel junction surface to cause carriers in the source region to tunnel through, and a drain region arranged adjacent to the channel region and to which the carriers are transported from the channel region; a gate part formed with a gate insulating film and a gate electrode arranged in this order on the semiconductor layer; and an insulation part arranged to cover a side face of the gate electrode, and having: a structure in which part of the channel region and part of the source region with a support surface formed with respect to the part of the channel region as a surface parallel to a bottom surface of the gate part as a surface on the side of the gate insulating film are arranged in this order under the bottom surface to cause the part of the channel region to separate the bottom surface and the support surface from each other; and a drain offset structure in which a drain offset region is formed in the semiconductor layer to keep the gate electrode and the drain region away from each other, wherein when a gate length as the width of the gate electrode in a direction parallel to a channel direction between the source region and the drain region is denoted by $L_G$, and an extension distance of the source region extended toward the drain region in a direction parallel to the channel direction from a position in the source region opposite in the height direction of the gate electrode to a source-side reference position as a side face position of the gate electrode closest to the source region is denoted by $L_{OV}$, the tunnel field-effect transistor is so designed that $L_{TG}$ expressed in Formula (1) below as a shortest distance between a position of an extension end of the source region, which is most extended toward the drain region based on a side face position of the gate electrode closest to the drain region and set as a drain-side reference position, and a position in the semiconductor layer opposite in the height direction of the gate electrode to the drain-side reference position satisfies respective conditions of Inequality (3) and Inequality (5) below,

[Math. 12]

$$L_{TG}=L_G-L_{OV} \quad (1)$$

[Math. 13]

$$L_{TG}>L_{direct}-L_{OFF} \quad (3)$$

[Math. 14]

$$L_{TG}<\sqrt{l_{t\_OFF}^2-T_{EPI}^2} \quad (5)$$

where in Inequality (3), $L_{direct}$ denotes a shortest distance between the source region and the drain region to regulate a direct tunnel through which the carriers move between the source region and the drain region by forming a tunnel path to connect the source region and the drain region, and $L_{OFF}$ denotes a drain offset length to regulate a length of the channel direction in the drain offset region, and in Inequality (5), $l_{t\_OFF}$ denotes a shortest tunnel distance over which the carriers move from the source region to the channel region through the tunnel junction surface in an OFF state of the tunnel field-effect transistor, and $T_{EPI}$ denotes a shortest distance between the bottom surface and the support surface.

Advantageous Effect of the Invention

According to the present invention, there can be provided a tunnel field-effect transistor capable of solving the various problems in the conventional technique and contributing to an improvement in the drain current ON/OFF ratio characteristics, and a method for designing the same.

MODES FOR CARRYING OUT THE INVENTION (Tunnel Field-Effect Transistor and Method for Designing Same)

A tunnel field-effect transistor of the present invention and a method for designing the same will be described with reference to the accompanying drawings.

First Embodiment

Figure 7:
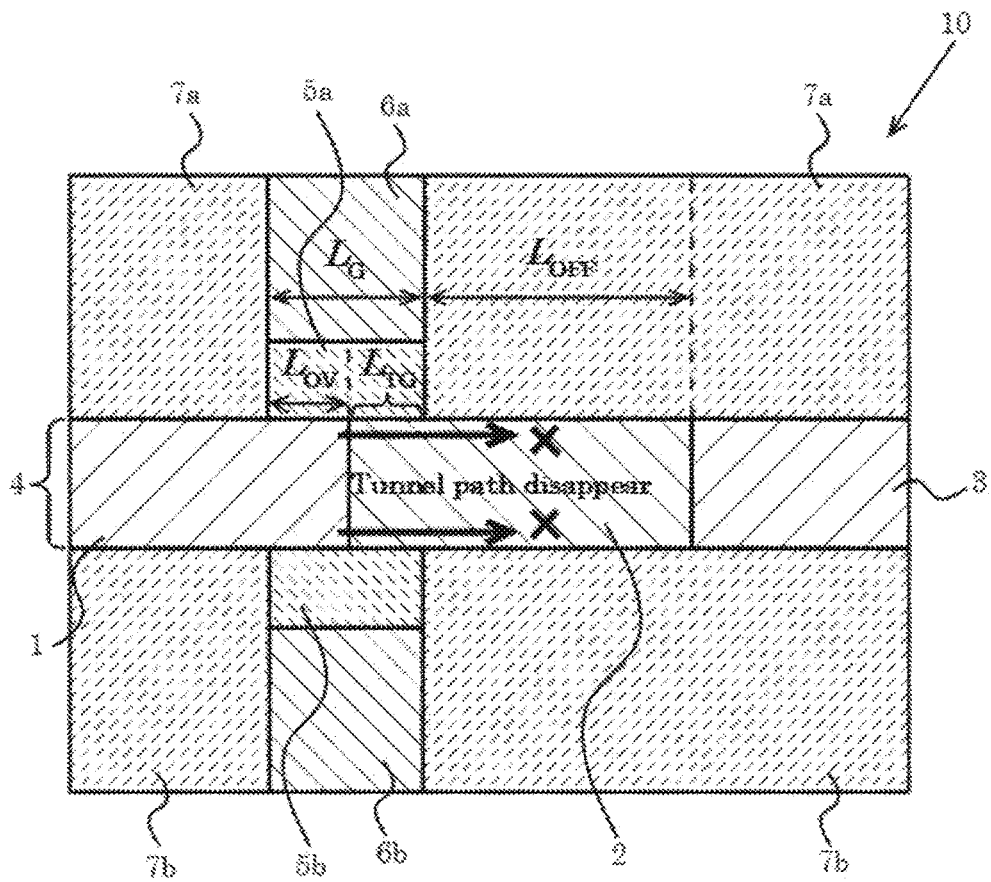
FIG. 7 is an explanatory view for describing the structure of a tunnel field-effect transistor 10 according to a first embodiment.

A first embodiment will be described with reference to FIG. 7. FIG. 7 is an explanatory view for describing a tunnel field-effect transistor 10 according to the first embodiment.

The tunnel field-effect transistor 10 includes a semiconductor layer 4, a first gate part, a second gate part, and insulation parts 7a and 7b.

<Semiconductor Layer>

The semiconductor layer 4 is formed to include a source region 1, a channel region 2 arranged adjacent to the source region 1 and whose boundary surface with the source region is set as a tunnel junction surface to cause carriers in the source region 1 to tunnel through, and a drain region 3 arranged adjacent to the channel region 2 and to which the carriers are transported from the channel region 2. Namely, the semiconductor layer 4 is so formed that the source region 1 and the drain region 3 are placed opposite to each other through the channel region 2 in an in-layer direction.

The tunnel junction surface is made by forming the source region 1 and the channel region 2 to make the energy levels of the valence band and the conduction band of the channel region change rapidly from the source region 1 to the channel region 2. More specifically, the tunnel junction surface can be made by giving a sharp concentration difference between impurities to the interface between the source region 1 and the channel region 2, by forming a heterojunction between materials having a large difference in energy level, or the like.

The method of forming the semiconductor layer having such a tunnel junction surface is not particularly limited. For example, there is a method of ion-implanting different impurities into a semiconductor material that forms the semiconductor layer to form the source region 1 and the drain region 3.

The semiconductor material is not particularly limited. Examples of the semiconductor material include silicon (Si), germanium (Ge), and an alloy thereof (SiGe), and a known semiconductor substrate formed of such a semiconductor material can be used.

Further, the ion-implanted impurities are not particularly limited as long as the materials generate carriers in the source region 1 and the drain region 3, and examples of the impurities include boron (B), phosphorus (P), and arsenic (As).

Further, the ion implantation method is not particularly limited, and a known ion implantation method can be carried out. For example, a known ion implanter can be used to implant, into the semiconductor material layer, raw material gas such as boron difluoride ($BF_2$) gas, phosphine ($PH_3$) gas, or arsine ($AsH_3$) gas, or raw solid material such as solid P or solid As as an ion source.

As the method of forming the source region 1 and the drain region 3, there is a method for activating the impurities by activation annealing after the ion implantation.

The activation annealing method is not particularly limited, and any method can be carried out in the same manner as known activation annealing. For example, there is a method of using a halogen lamp to irradiate light and heat the impurities with the light.

In this case, a region other than the source region 1 and the drain region 3 in the semiconductor material layer is the channel region 2.

Instead of Si, Ge, or SiGe alloy as the semiconductor material, a compound semiconductor material such as GaAs, InGaAs, InAs, or InP may also be used.

In this case, the semiconductor layer 4 may be formed of a single compound semiconductor or the semiconductor layer 4 having the tunnel junction surface may be formed by a heterojunction of two or more compound semiconductor materials.

In the former case, as the method of forming the source region 1, the channel region 2, and the drain region 3, there is a method of ion-implanting the impurities like in the case of Si, Ge, or SiGe alloy to form the source region 1 and the drain region 3 with a region other than them set as the channel region 2.

In the latter case, as the method of forming the source region 1, the channel region 2, and the drain region 3, there is a method in which, for example, the source region 1 is formed of InAs, the drain region 3 is formed of InP, and the channel region 2 is formed of InGaAs to form heterojunctions with a large energy level difference in the interface between regions and set the heterojunction surface between the source region 1 and the channel region 2 as the tunnel junction surface.

Note that the heterojunctions may be formed in any combination of Si, Ge, and SiGe alloy, or GaAs, InGaAs, InAs, InP, and the like.

Note that both P-type operation and N-type operation can be realized as the tunnel field-effect transistor 10. In the case of the P-type operation, the semiconductor layer 4 may be such that the source region 2 is formed as an N-type semiconductor region and the drain region is formed as a P-type semiconductor region, while in the case of the N-type operation, the semiconductor layer 4 may be such that the source region 2 is formed as a P-type semiconductor region and the drain region is formed as an N-type semiconductor region.

<Gate Parts>

The first gate part has a column-shaped structure in which a gate insulating film 5a and a gate electrode 6a are arranged in this order on the semiconductor layer 4.

The second gate part has a column-shaped structure in which, when the surface of the semiconductor layer 4 with the first gate part arranged thereon is set as a top surface, the second gate part is arranged under a bottom surface of the semiconductor layer 4 in a position to face the first gate part and formed with a gate insulating film 5b and a gate electrode 6b arranged in this order under the bottom surface of the semiconductor layer 4.

Namely, the tunnel field-effect transistor 10 has a double-gate structure in which the respective gate parts are arranged in positions to face each other on the top surface and under the bottom surface of the semiconductor layer 4. Note that the tunnel field-effect transistor 10 has a symmetric structure along a line passing through the center of the thickness of the semiconductor layer 4 in the channel direction, but it may be an asymmetric structure between the first gate part and the second gate part, and $L_{TG}$ conditions to be described later may also be conditions satisfied in relation to at least either of the first gate part and the second gate part.

As a variation, the tunnel field-effect transistor 10 may also be constructed to have an SOI structure, instead of the double-gate structure, in which the semiconductor layer 4 and a gate part corresponding to the first gate part are arranged in this order on a silicon oxide film (BOX layer).

The method of forming the gate insulating films 5a and 5b is not particularly limited, and there are an ALD (Atomic Layer Deposition) method, a sputtering method, and a CVD (Chemical Vapor Deposition) method.

The material used to form the gate insulating films 5a and 5b is not particularly limited, and can be selected appropriately according to the purpose. For example, there are $SiO_2$, $HfO_2$, $Al_2O_3$, $ZrO_2$, and the like.

The method of forming the gate electrodes 6a and 6b is not particularly limited, and there are the sputtering method, the CVD method, and the like.

The material used to form the gate electrodes is not particularly limited, and can be selected appropriately according to the purpose. For example, there are Al, TiN, TaN, NiSi, and the like.

—Insulation Parts—

The insulation part 7a is arranged to cover the side face of the gate electrode 6a, and the insulation part 7b is arranged to cover the side face of the gate electrode 6b. In this example, the insulation part 7a, 7b is arranged to cover the side face of the first gate part or the second gate part.

The method of forming the insulation parts 7a and 7b is not particularly limited, and there are the ALD method, the sputtering method, and the CVD method.

The material used to form the insulation parts 7a and 7b is not particularly limited, and can be selected appropriately according to the purpose. For example, there is $SiO_2$ or the like.

Note that the insulation part 7a, 7b corresponds to an insulating sidewall or an interlayer insulating film to ensure insulation from the outside, and can be formed in the same manner as these known members.

—Structure—

As the tunnel field-effect transistor 10, part of the source region 1 is arranged under the bottom surface of the first gate part as the surface on the side of the gate insulating film 5a to cause the bottom surface and the part of the source region 1 come into contact with each other. Namely, the first gate part and the source region 1 come into contact with each other without being separated from each other.

The relationship between the second gate part and the source region 1 is also the same as the relationship between the first gate part and the source region 1 because of the line symmetric structure.

Further, the tunnel field-effect transistor 10 has a drain offset structure in which a drain offset region is formed in the semiconductor layer 4 to keep the gate electrode 6a, 6b and the drain region 3 away from each other. Namely, the drain offset structure is obtained in such a manner that the position of the side face (right side face in FIG. 7) of the gate electrode 6a (gate electrode 6b) closest to the gate electrode 6a (gate electrode 6b) is set as a drain-side reference position, and $L_{OFF}$ as the shortest distance between a position of the semiconductor layer 4, opposite to the drain-side reference position in the height direction of the gate electrode 6a (gate electrode 6b), and the drain region 3 is set as a drain offset length to regulate a direct tunnel through which the carriers move between the source region 1 and the drain region 3 by forming a tunnel path to connect the source region 1 and the drain region 3 in relation to $L_{TG}$ to be described later.

—Positional Relationship—

The tunnel field-effect transistor 10 is designed based on a principle that, when the part of the channel region 2 controlled in the first gate part (the second gate) is made narrow, that is, when the extension end of the source region 1 is extended up to a position near the side face of the gate electrode 6a (gate electrode 6b) on the side of the drain region 3, a steep rise in drain current can be obtained due to a short tunnel path having a high tunnel rate without generating a long tunnel path having a low tunnel rate, and hence, excellent drain current ON/OFF ratio characteristics can be obtained.

Thus, the positional relationship between the extension end of the source region 1 and the side face of the gate electrode 6a (gate electrode 6b) on the side of the drain region 3 is the core of the technology in the present invention.

This positional relationship will be described in detail below.

—Upper Limit of $L_{TG}$—

Since it is obvious that the above principle can be applied when the extension end of the source region 1 is located near the side face of the gate electrode 6a (gate electrode 6b) on the side of the drain region 3, the description will be made from the opposite perspective that the above principle can be applied no matter how far the extension end of the source region 1 and the side face of the gate electrode 6a (gate electrode 6b) on the side of the drain region 3 away from each other.

The tunnel field-effect transistor 10 is so designed that, when the gate length as a width of the gate electrode 6a (gate electrode 6b) in a direction parallel to the channel direction between the source region 1 and the drain region 3 is denoted by $L_G$ and an extension distance of the source region 1 extended toward the drain region 3 in a direction parallel to the channel direction from a position in the source region 1 opposite in the height direction of the gate electrode 6a (gate electrode 6b) to a source-side reference position as a position of the side face (left side face in FIG. 7) of the gate electrode 6a (gate electrode 6b) closest to the source region 1 is denoted by $L_{OV}$, $L_{TG}$ expressed in Formula (1) below as a shortest distance between a position of the extension end of the source region 1, which is most extended toward the drain region 3 based on a side face (right side face in FIG. 7) of the gate electrode 6a (gate electrode 6b) closest to the drain region 3 and set as the drain-side reference position, and a position in the semiconductor layer 4 opposite in the height direction of the gate electrode 6a (gate electrode 6b) to the drain-side reference position satisfies respective conditions of Inequality (2) and Inequality (3) below.

[Math. 15]

$$L_{TG}=L_G-L_{OV} \quad (1)$$

[Math. 16]

$$L_{TG}<l_{t\_OFF} \quad (2)$$

[Math. 17]

$$L_{TG}>L_{direct}-L_{OFF} \quad (3)$$

Note that $l_{t\_OFF}$ in Inequality (2) denotes the shortest tunnel distance over which the carriers moves from the source region 1 to the channel region 2 through the tunnel junction surface in an OFF state of the tunnel field-effect transistor 10.

Further, in Inequality (3), $L_{direct}$ denotes the shortest distance between the source region 1 and the drain region 3 to regulate the direct tunnel through which the carriers move between the source region 1 and the drain region 3 by forming a tunnel path to connect the source region 1 and the drain region 3, and $L_{OFF}$ denotes the drain offset length to regulate the length of the drain offset region in the channel direction.

Note that the condition of Inequality (3) is derived from a condition $L_{OFF}>L_{direct}-L_{TG}$ as a condition that must be satisfied by the drain offset length $L_{OFF}$ as the drain offset structure to regulate the direct tunnel through which the carriers move between the source region 1 and the drain region 3 by forming the tunnel path to connect the source region 1 and the drain region 3.

Further, as $L_{direct}$ in Inequality (3), it is known to have a material-specific value, and the value is set from publicly-available information. For example, when the forming material of the source region 1 and the channel region 2 is Si, it is about 30 nm.

The reason for employing the condition of Inequality (2) will be described below.

In the following, description is made assuming that the value of $L_{TG}$ in a direction parallel to the channel direction from the drain region 3 to the source region 1 based on the drain-side reference position (zero) is set as a positive value (upper limit side) and the value of $L_{TG}$ in a direction parallel to the channel direction from the source region 1 to the drain region 3 is set as a negative value (lower limit side).

Figure 1:
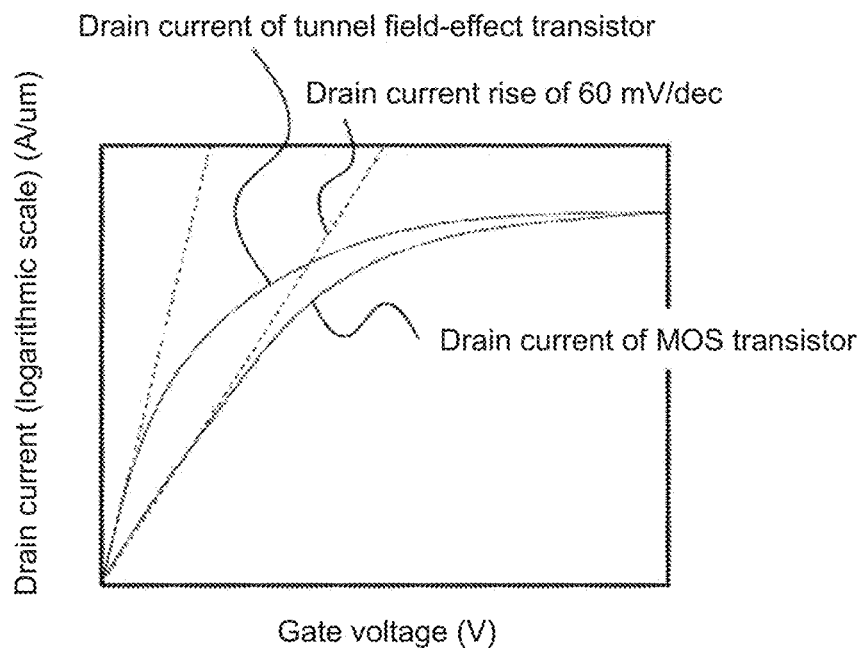
FIG. 1 is a graph illustrating transfer characteristics of transistors.
Figure 2:
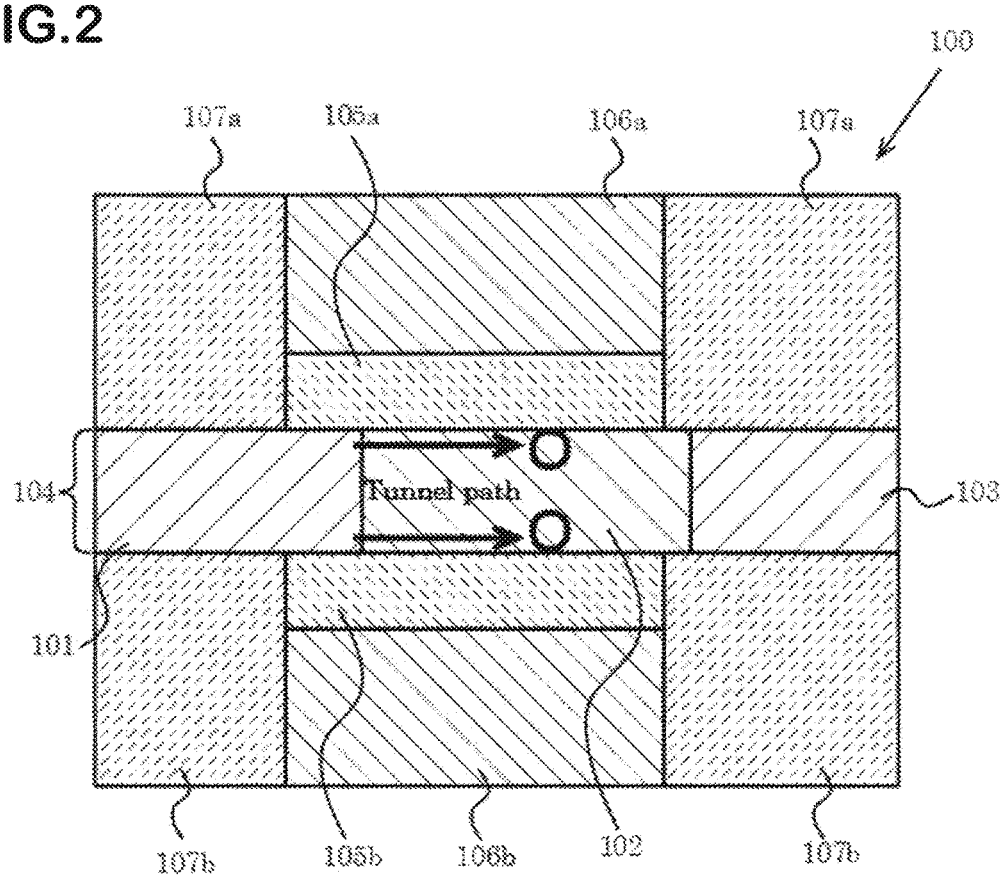
FIG. 2 is a view illustrating a schematic structure of a conventional tunnel field-effect transistor.
Figure 3:
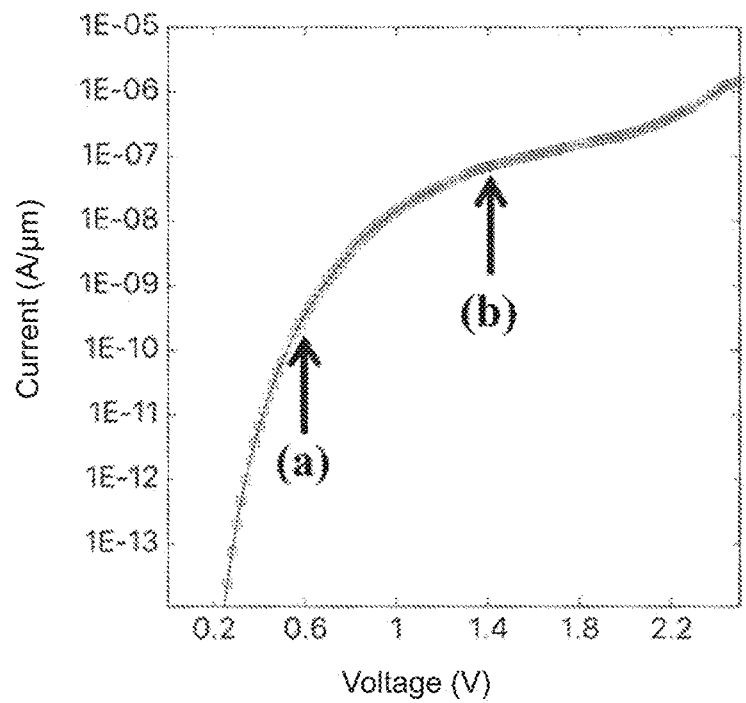
FIG. 3 is a graph illustrating drain current-gate voltage characteristics of a tunnel field-effect transistor 100.
Figure 4A:
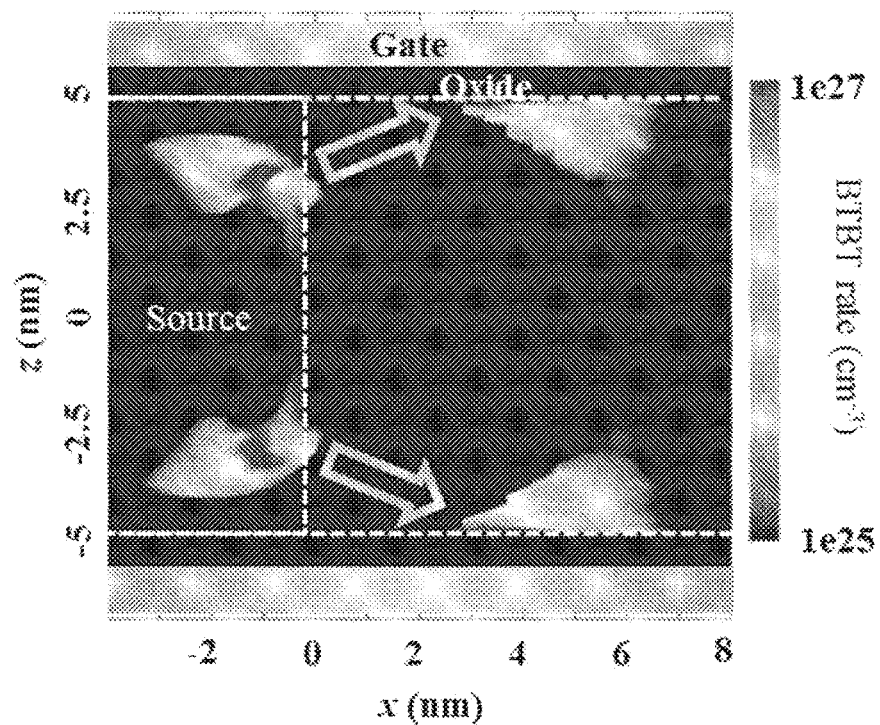
FIG. 4(a) is a FIG. (1) illustrating a spatial distribution of the amount of carrier generation due to band-to-band tunneling at a primary gate voltage.
Figure 4B:
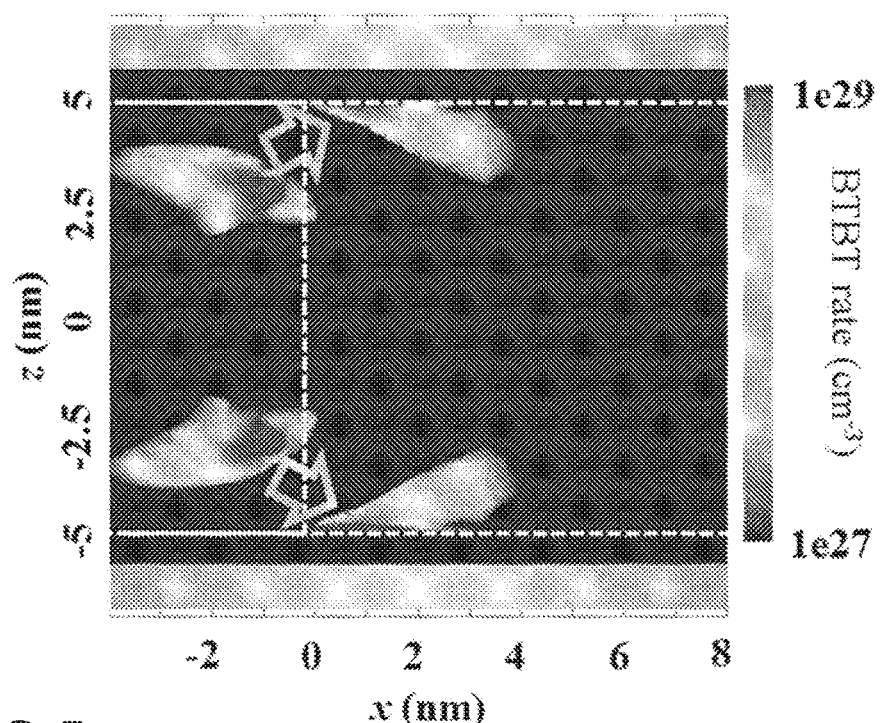
FIG. 4(b) is a FIG. (1) illustrating a spatial distribution of the amount of carrier generation due to band-to-band tunneling at a secondary gate voltage.
Figure 5:
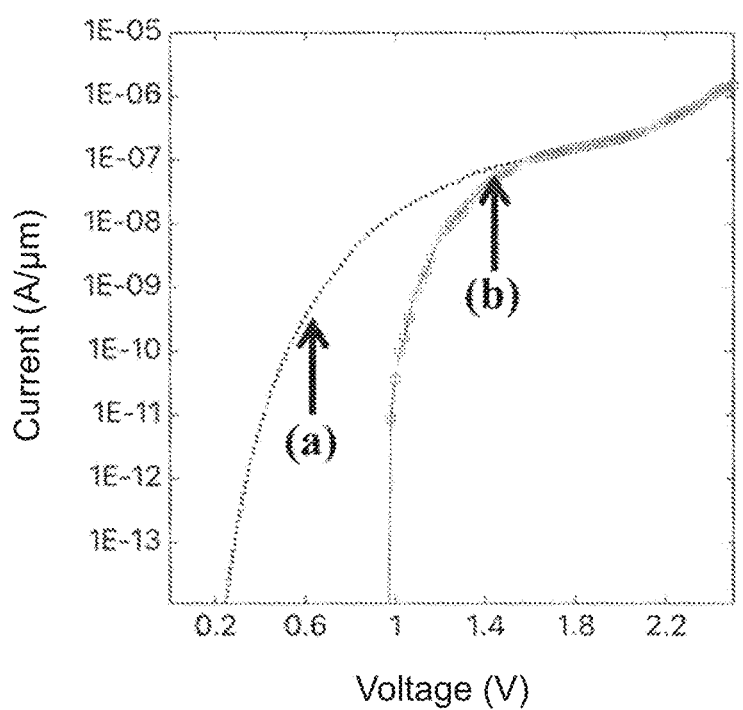
FIG. 5 is a graph illustrating drain current-gate voltage characteristics of a modified tunnel field-effect transistor.
Figure 6A:
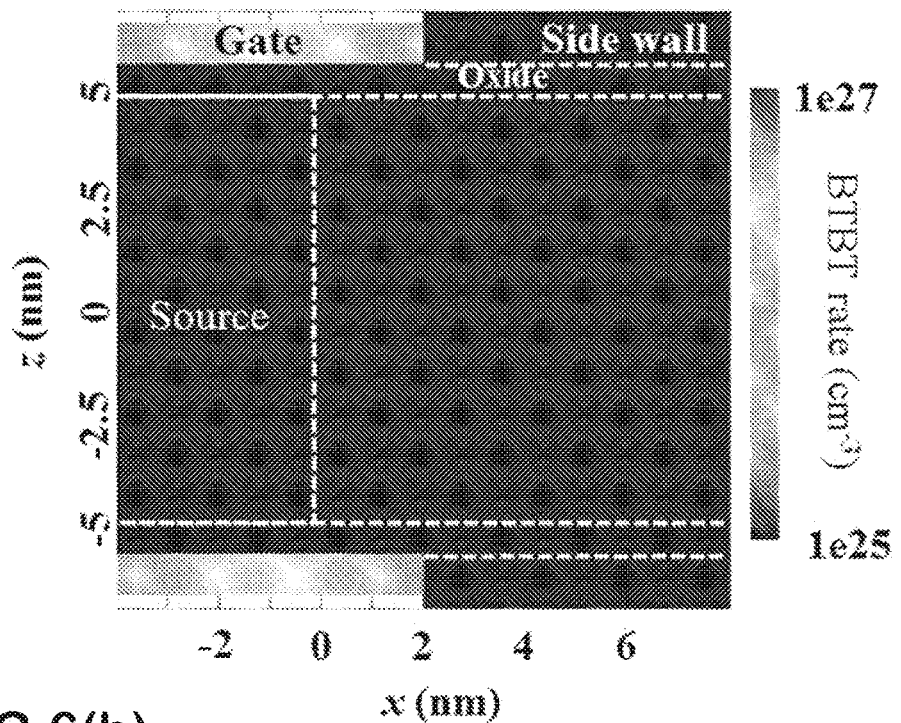
FIG. 6(a) is a FIG. (2) illustrating a spatial distribution of the amount of carrier generation due to band-to-band tunneling at the primary gate voltage.
Figure 6B:
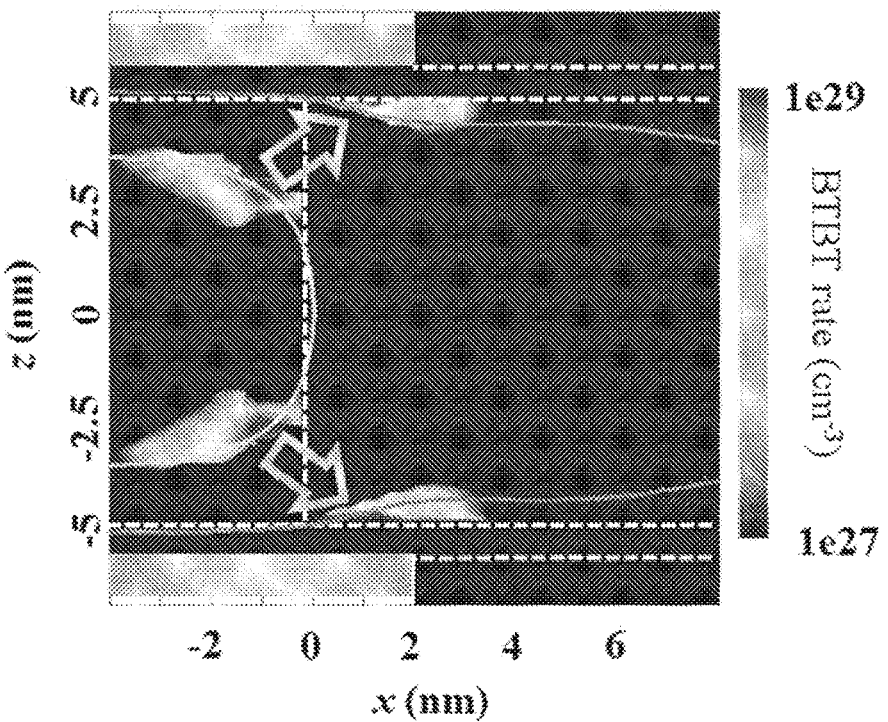
FIG. 6(b) is a FIG. (2) illustrating a spatial distribution of the amount of carrier generation due to band-to-band tunneling at the secondary gate voltage.

As $L_{TG}$ is set to a larger value as the positive value to get closer to the structure of the conventional tunnel field-effect transistor 100 (see FIG. 2), the generation of a long tunnel path having a low tunnel rate cannot be inhibited eventually, and hence the effect of improving the drain current ON/OFF ratio is lost.

First, an ON state of the tunnel field-effect transistor 10 will be described in order to discuss the effect of improving the ON/OFF ratio.

Figure 8:
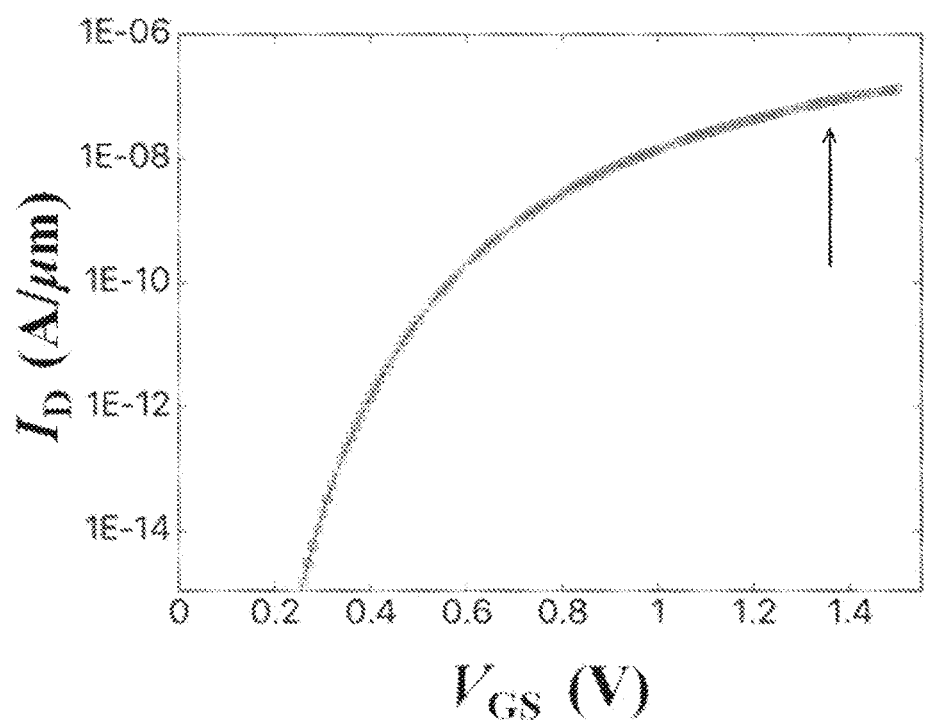
FIG. 8 is an explanatory graph illustrating that an increase in drain current is slowed down as the gate voltage increases.

In the tunnel field-effect transistor 10, when a high gate voltage is applied as indicated by the arrow in FIG. 8 and depletion progresses in the neighborhood of the extension end of the source region 1, the tunnel distance change due to the gate voltage becomes gentle to slow down the increase in drain current consequently. FIG. 8 is an explanatory graph illustrating a state where the increase in drain current is slowed down as the gate voltage increases.

Figure 9:
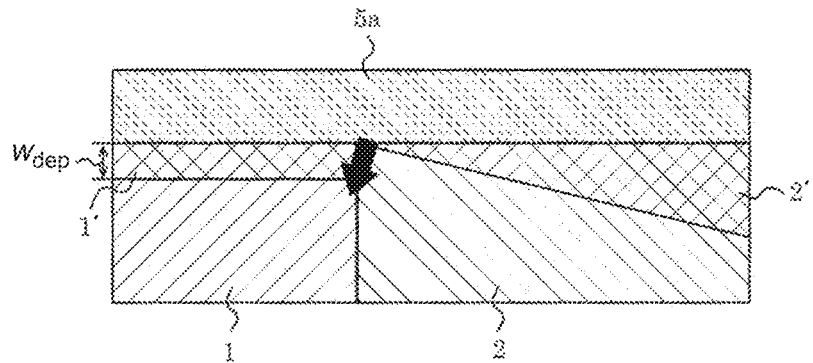
FIG. 9 is an enlarged view of a part between a source region and a channel region to describe an ON state.

In the tunnel field-effect transistor 10, when a sufficiently high gate voltage is applied, the carrier concentration in the neighborhood of the extension end of the source region 1 is depleted up to an intrinsic carrier concentration and an accumulation layer 2' as a tunneling destination extends to the extension end as illustrated in FIG. 9. This state is defined as the ON state. Note that FIG. 9 is an enlarged view of a part between the source region and the channel region to describe the ON state.

In the ON state, the shortest tunnel distance is determined almost in the same direction as the thickness direction of the channel region 2, and the distance is about a depletion layer width $W_{dep}$ on the upper end side of the source region 1.

Further, in the ON state, since the shortest tunnel distance does not change significantly from the depletion layer width $W_{dep}$, the increase in drain current due to the rise in gate voltage becomes small as illustrated in FIG. 8.

Thus, a tunnel distance $l_{t\_ON}$ of the carriers in the ON state can be approximated to the depletion layer width $W_{dep}$ on the upper end side of the source region 1 illustrated in FIG. 9 and expressed as Approximate Expression (A) below.

[Math. 18]

$$l_{t\_ON} \sim W_{dep} \quad (A)$$

The depletion layer width $W_{dep}$ can also be expressed in Formula (B) below based on further simple depletion layer approximation.

[Math. 19]

$$W_{dep} = \sqrt{\frac{2\epsilon_S \epsilon_0 \phi_B}{q n_{P0}}} \quad (B)$$

Note that $\varphi_B$ in Formula (B) denotes a difference between a Fermi level $E_{FS}$ and an intrinsic Fermi level $E_I$ of the source region 1, $\epsilon_0$ denotes vacuum permittivity, $\epsilon_S$ denotes a relative permittivity of the forming material of the source region 1, q denotes elementary charge (C), and $n_{P0}$ denotes an impurity concentration (cm$^{-3}$) of the source region 1.

Further, the band-to-band tunneling current ($I_{BTBT}$) is generally proportional to the maximum value of a formula of the carrier generation rate ($G_{BTBT}$) expressed in Formula (C) below.

[Math. 20]

$$G_{BTBT} = A\left(\frac{F}{F_0}\right)^P \exp\left(-\frac{B}{F}\right) \quad (C)$$

Note that A, B, and P in Formula (C) indicate respective physical parameters A, B, and P in Kane's formula described in Reference 1 below, and $F_0$ denotes a normalization constant.

Note that Reference 1 is literature in which Kane's formula and Kane's physical parameters advocated in Reference 2 below are studied and described in detail, and A, B, P and $F_0$ are set in Formula (C) according to the description in Reference 1.

Reference 1: K. H. Kao et al., IEEE Trans. Electron Devices 59, 292 (2012)

Reference 2: Kane, J. Appl. Phys. 32, 83 (1961)

Here, there is a relationship among a non-local electric field F, an effective band gap $E_{geff}$ of the material, and a tunnel distance $l_{t\_ON}$ of carriers as expressed in Formula (D) below.

[Math. 21]

$$F = \frac{E_{geff}/q}{l_t} \quad (D)$$

Therefore, Formula (C) can be expressed from the relationship of Formula (D) as Formula (E) below.

[Math. 22]

$$G_{BTBT} = A\left(\frac{F}{F_0}\right)^P \exp\left(-\frac{qBl_t}{E_{geff}}\right) \quad (E)$$

When the tunnel field-effect transistor 10 exhibits N-type operation, the effective band gap $E_{geff}$ of the material is expressed in Formula (F) below, while when the tunnel field-effect transistor 10 exhibits P-type operation, it is expressed in Formula (G) below.

[Math. 23]

$$E_{geff} = E_{C\_CH} - E_{V\_S} \quad (F)$$

$$E_{geff} = E_{C\_S} - E_{V\_CH} \quad (G)$$

In Formulas (F) and (G), $E_{C\_S}$ denotes conduction band energy of the forming material of the source region 1, $E_{V\_S}$ denotes valence band energy of the forming material of the source region 1, $E_{C\_CH}$ denotes conduction band energy of the forming material of the channel region 2, and $E_{V\_CH}$ denotes valence band energy of the forming material of the channel region 2.

Figure 10:
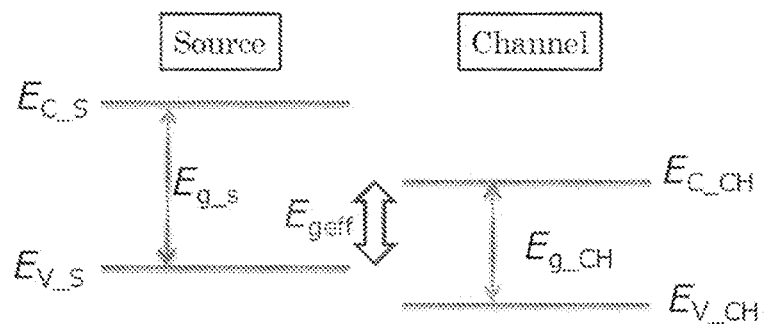
FIG. 10 is an explanatory diagram for describing $E_{geff}$ of a heterojunction type tunnel field-effect transistor exhibiting N-type operation.

When the source region 1 and the channel region 2 are formed of a single semiconductor material and the tunnel junction surface is formed by a homojunction, the effective band gap $E_{geff}$ of the material is equal to the energy gap $E_g$ of this single semiconductor material, while when the source region 1 and the channel region 2 are formed of different semiconductor materials like in the example illustrated in FIG. 10 and the tunnel junction surface is formed by the heterojunction, the effective band gap $E_{geff}$ needs to be treated according to each of Formulas (F), (G), respectively. FIG. 10 is an explanatory diagram for describing $E_{geff}$ of a heterojunction type tunnel field-effect transistor exhibiting N-type operation.

As will be understood from Formula (E), since the current value of the drain current is greatly affected by the exponent of the exp term, it is sufficient to pay attention to this exp term in order to see a change in drain current.

When the ON/OFF current ratio to determine the line of OFF current is denoted by $R_{ONOFF}$, $l_{t\_OFF}$ indicative of the shortest tunnel distance over which the carriers move from the source region 1 to the channel region 2 through the tunnel junction surface in the OFF state of the tunnel field-effect transistor 10 can be expressed in Approximate Expression (H) below from a magnitude comparison of the exp term in Formula (E) and tunnel distance $l_{t\_ON}$ in the ON state expressed in Approximate Expression (A).

[Math. 24]

$$l_{t\_OFF} \sim W_{dep} + \frac{E_{geff}/q}{B}\log(R_{ONOFF}) \quad (H)$$

Among tunnel distances capable of being taken by the long tunnel path having the low tunnel rate, this length of $l_{t\_OFF}$ corresponds to a tunnel distance having the shortest length. If only the movement of carriers resulting from a tunnel path having a length shorter than this tunnel path is allowed, it can enjoy the effect of a steep rise in drain current.

Namely, when such a condition of Inequality (2) as to set $L_{TG}$ less than $l_{t\_OFF}$ as mentioned above is satisfied, it can enjoy only the effect of the steep rise in drain current by the short tunnel path having the high tunnel rate without generating the drain current by the long tunnel path having the low tunnel rate.

[Math. 25]

$$L_{TG} < l_{t\_OFF} \tag{2}$$

For example, assuming that the tunnel field-effect transistor 10 is such that the source region 1 and the channel region 2 are formed of Si, the impurity concentration of the source region 1 is $2 \times 10^{20}$ cm$^{-3}$, and $\varphi_B$ is 0.5 V, $l_{t\_ON}$ can be estimated as 1.8 nm from Approximate Expression (A) mentioned above. Further, if $R_{ONOFF}$ to be required is set to $10^7$, $l_{t\_OFF}$ can be estimated as 11.3 nm from Formula (H) mentioned above.

Therefore, the condition of $L_{TG}$ on this assumption can be set as $L_{TG}$ <11.3 nm according to Inequality (2) mentioned above.

From the verification results of simulation tests to be described later, it is supported that the condition of Inequality (2) mentioned above is reasonable.

—Lower Limit of $L_{TG}$—

When the value of $L_{TG}$ (=$L_G$-$L_{OV}$) is 0 or a negative value, that is, when the extension end of the source region 1 is at a position in the semiconductor layer 4 opposite to the drain-side reference position in the height direction of the gate electrode 6a (gate electrode 6b) or when the extension end of the source region 1 is brought closer to the drain region 3 beyond this position, a direct tunnel occurs between the source region 1 and the drain region 3 and the direct tunnel current can increase up to a level hard to ignore. Therefore, $L_{TG}$ is required to satisfy Inequity (3) below.

[Math. 26]

$$L_{TG} > L_{direct} - L_{OFF} \tag{3}$$

$L_{OFF}$ can be set to any large value in principle. However, when the value of $L_{TG}$ (=$L_G$-$L_{OV}$) is 0 or a negative value, since the tunnel field-effect transistor 10 will be upsized if $L_{OFF}$ increases too much, it is preferred to be 60 nm or less from the perspective of miniaturization.

As described above, the lower limit of $L_{TG}$ given by Inequality (3) mentioned above is set widely depending on the drain offset length $L_{OFF}$. However, from a condition for the depletion of the source region 1 to be described later, the tunnel field-effect transistor 10 is required to satisfy a condition of $L_{TG}$ given in Inequality (4) below in addition to the condition of Inequality (3) mentioned above.

[Math. 27]

$$L_{TG} > -T_{OX}\sqrt{\frac{4\epsilon_{SW}^2 \beta^2}{\epsilon_{OX}^2} - 1} \tag{4}$$

In Inequality (4), $T_{OX}$ denotes the thickness of the gate insulating film 5a (5b), $\epsilon_{OX}$ denotes the relative permittivity of the forming material of the gate insulating film 5a (5b), $\epsilon_{SW}$ denotes the relative permittivity of the forming material of the insulation part 7a (7b), and ß denotes the amplification factor of an electric field due to an electric field concentration at the position of the extension end of the source region 1.

The condition of Inequality (4) for the lower limit mentioned above will be described in detail below.

A structure in a case where the value of $L_{TG}$ (=$L_G$-$L_{OV}$) is 0 or a negative value will be described by particularly taking, as an example, the case of a negative value.

In this case, the extension end of the source region 1 exists at a position beyond the position in the semiconductor layer 4 opposite to the drain-side reference position in the height direction of the gate electrode 6a (gate electrode 6b). This part of the source region 1 beyond the position contacts with the insulation part 7a (insulation part 7b).

Therefore, when the value of $L_{TG}$ (=$L_G$-$L_{OV}$) is a negative value, the part contacting with the insulation part 7a (insulation part 7b) is also required to be depleted in addition to a part contacting with the first gate part (the second gate part) in the source region 1 so that the tunneling destination of carriers in the source region 1 is formed in the channel region 2 in order to get the ON state.

Figure 11:
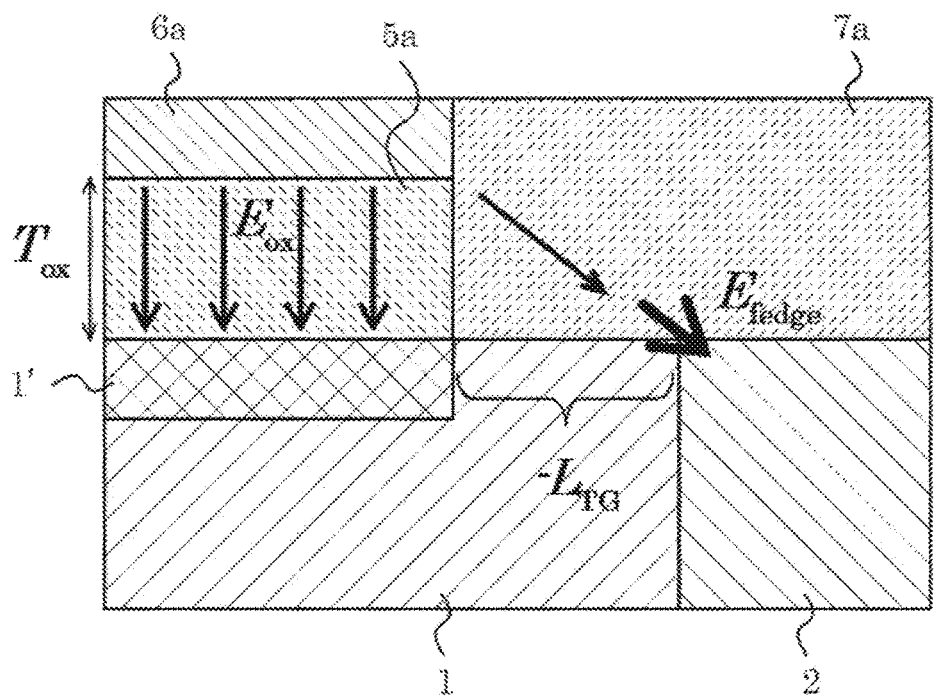
FIG. 11 is an enlarged view illustrating the relationship among a gate part, a source region 1, a channel region 2, and an insulation part 7a when the value of $L_{TG}$ (=$L_G$−$L_{OV}$) is a negative value.

This means that the ON current cannot be obtained unless a gate voltage strong enough for a fringe electric field to deplete the extension end of the source region 1 through the insulation part 7a (insulation part 7b) is applied. Specifically, the ON current cannot be obtained unless a depletion region 1' is widened until the whole part indicated by "-$L_{TG}$" in the source region 1 is depleted as illustrated in FIG. 11. FIG. 11 is an enlarged view illustrating the relationship among the gate part, the source region 1, the channel region 2, the drain region 3, and the insulation part 7a when the value of $L_{TG}$ ($L_G$-$L_{OV}$) is a negative value.

Referring to FIG. 11, a distance $T_{edge}$ between a side face position of the gate electrode 6a closest to the drain region 3 (bottom right corner of the gate electrode 6a in the figure) and an upper part of the extension end of the source region 1 (upper right corner of the source region 1 in the figure) can be expressed in Formula (J) below.

[Math. 28]

$$T_{edge} = \sqrt{T_{OX}^2 + L_{TG}^2} \tag{J}$$

Note that $T_{OX}$ in Formula (J) denotes the thickness of the gate insulating film 5a.

When the amplification factor of the electric field due to the electric field concentration in the upper part of the extension end of the source region 1 (upper right corner of the source region 1 in the figure) is denoted by ß, the fringe electric field $E_{fedge}$ in the upper part of the extension end of the source region 1 is expressed in Formula (K) below using an electric field $E_{OX}$ produced by the gate insulating film 5a.

[Math. 29]

$$E_{fedge} = \frac{T_{OX}}{T_{edge}} \beta E_{OX} \tag{K}$$

When the electric flux density $\epsilon_{SW} E_{fedge}$ of the extension end of the source region 1 determined by this fringe electric field $E_{fedge}$ is significantly smaller than the electric flux density $\epsilon_{OX} E_{OX}$ in the gate insulating film 5a, the gate voltage to deplete the whole part indicated by "-$L_{TG}$" in the source region 1 in order to get the ON state becomes excessive.

In addition, the controllability of the gate voltage related to depletion on the extension end side of the source region 1 is lowered, and this adversely affects steep slope characteristics that exhibit the drain current-gate voltage characteristics.

Therefore, if the lowering of the electric flux density $\varepsilon_{SW}E_{fedge}$ of the extension end of the source region 1 is restricted up to half of the electric flux density $\varepsilon_{OX}E_{OX}$ in the gate insulating film 5a, it will be required to satisfy the condition of Inequality (4) as the condition of $L_{TG}$ as mentioned above.

[Math. 30]

$$L_{TG} > -T_{OX}\sqrt{\frac{4\varepsilon_{SW}^2\beta^2}{\varepsilon_{OX}^2} - 1} \tag{4}$$

For example, assuming that $T_{OX}$ is 0.8 nm, $\varepsilon_{SW}$ and $\varepsilon_{OX}$ take an equal value, and ß is 1.2 in the tunnel field-effect transistor 10, a condition of $L_{TG}$ >-1.75 nm is obtained from Inequality (4) mentioned above.

However, when the permittivity of the insulation part 7a is small, the value of $L_{TG}$ in Inequality (4) mentioned above may be the square root of a negative number. This means that it is difficult to deplete the extension end of the source region 1 as negative $L_{TG}$. In this case, $L_{TG}$>0 is a condition to give the lower limit.

From the verification results of simulation tests to be described later, it is supported that the condition of Inequality (4) mentioned above is reasonable.

Although the description is made by taking the gate insulating film 5a, the gate electrode 6a, and the insulation part 7a as an example with reference to FIG. 11, similar matters can also be applied to the gate insulating film 5b, the gate electrode 6b, and the insulation part 7b to set the lower limit.

The semiconductor layer 4, the first gate part, the second gate part, and the insulation parts 7a and 7b in the tunnel field-effect transistor 10 have been described above. However, as will be understood from a comparison between FIG. 2 related to the tunnel field-effect transistor 100 and FIG. 7 related to the tunnel field-effect transistor 10, the tunnel field-effect transistor of the present invention can set $L_{TG}$ merely by narrowing the gate length ($L_G$) of a known tunnel field-effect transistor and can also be constructed by applying known technical matters that have not been described above. In addition, the tunnel field-effect transistor of the present invention can be manufactured by using existing equipment used for manufacturing the known tunnel field-effect transistor, resulting in excellent productivity.

Second Embodiment

Figure 12:
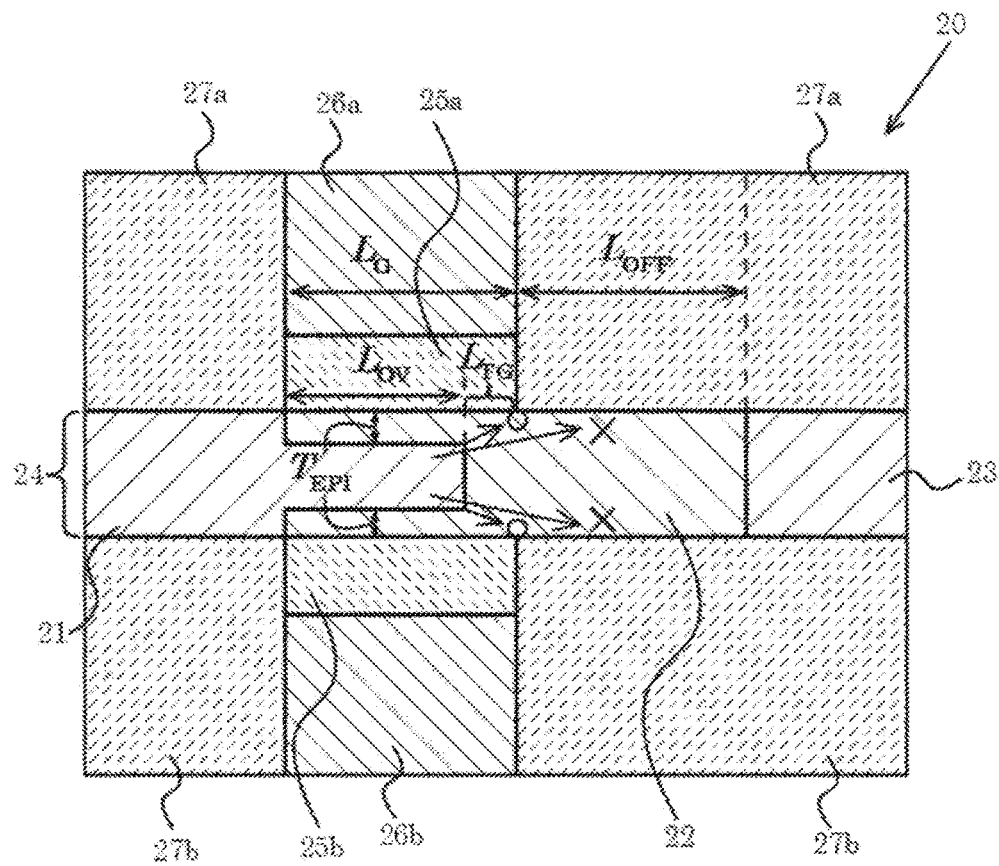
FIG. 12 is an explanatory view for describing a tunnel field-effect transistor 20 according to a second embodiment.

Next, a second embodiment will be described with reference to FIG. 12. FIG. 12 is an explanatory view for describing the structure of a tunnel field-effect transistor 20 according to the second embodiment.

The tunnel field-effect transistor 20 includes a semiconductor layer 24, a first gate part, a second gate part, and insulation parts 27a, 27b.

The semiconductor layer 24 is formed to include a source region 21, a channel region 22, and a drain region 23.

The first gate part is formed with a gate insulating film 25a and a gate electrode 26a arranged in this order on the semiconductor layer 24, thus having a column-shaped structure.

When the surface of semiconductor layer 24 with the first gate part arranged thereof is set as a top surface, the second gate part is arranged under a bottom surface of the semiconductor layer 24 in a position opposite to the first gate part, and formed with a gate insulating film 25b and a gate electrode 26b arranged in this order under the bottom surface, thus having a column-shaped structure.

The tunnel field-effect transistor 20 has a structure in which part of the channel region 22 and part of the source region 21 with a support surface formed with respect to the part of the channel region 22 as a surface parallel to a bottom surface of the first gate part as a surface on the side of the gate insulating film 25a are arranged in this order under the bottom surface to cause the part of the channel region 22 to separate the bottom surface and the support surface from each other. Further, as the line symmetric structure, the tunnel field-effect transistor 20 has a structure in which part of the channel region 22 and part of the source region 21 with a support surface formed with respect to the part of the channel region 22 as a surface parallel to a bottom surface of the second gate part as a surface on the side of the gate insulating film 25b are arranged in this order under the bottom surface to cause the part of the channel region 22 to separate the bottom surface and the support surface from each other.

The tunnel field-effect transistor 20 having these structures is different from the tunnel field-effect transistor 10 having such a structure that the source region 1 comes into contact with the first gate part and the second gate part without being separated from each other.

Based on this different point, in the tunnel field-effect transistor 20, the upper limit (positive value) of $L_{TG}$ expressed in Formula (1) is required to satisfy a condition of Inequality (5) below instead of Inequality (2) mentioned above. Namely, in the tunnel field-effect transistor 20, $L_{TG}$ expressed in Formula (1) mentioned above needs to satisfy respective conditions of Inequality (3) and Inequality (5) below.

[Math. 31]

$$L_{TG} = L_G - L_{OV} \tag{1}$$

[Math. 32]

$$L_{TG} > L_{direct} - L_{OFF} \tag{3}$$

[Math. 33]

$$L_{TG} < \sqrt{l_{t\_OFF}^2 - T_{EPI}^2} \tag{5}$$

Note that, in Inequality (3), $L_{direct}$ denotes the shortest distance between the source region 21 and the drain region 23 to regulate a direct tunnel through which the carriers move between the source region 21 and the drain region 23 by forming a tunnel path to connect the source region 21 and the drain region 23, and $L_{OFF}$ denotes a drain offset length to regulate the length of the drain offset region in the channel direction.

Further, in Inequality (5), $l_{t\_OFF}$ denotes the shortest tunnel distance over which the carriers move from the source region 21 to the channel region 22 through the tunnel junction surface in the OFF state of the tunnel field-effect transistor 20, and $T_{EPI}$ denotes the shortest distance between the bottom surface and the support surface.

The reason for being required to satisfy the condition of Inequality (5) mentioned above is as follows.

Namely, in the tunnel field-effect transistor 10, since the first gate part (second gate part) and the source region 21 are separated from each other at a distance of $T_{EPI}$, the condition of $L_{TG}$ considered through Approximate Expression (A) to Formula (H) to allow only the movement of carriers resulting from a tunnel path having a length shorter than the short tunnel path having the high tunnel rate is set based on a tunnel path from the upper part (lower part) of the extension end of the source region 1 in the direction parallel to the channel direction to a drain region end on the side of the drain region 3 under the bottom surface of the gate insulating film 5a (gate insulating film 5b). On the other hand, in the tunnel field-effect transistor 20, the condition of $L_{TG}$ is set based on a tunnel path extending in a direction of the arrow with the circle in FIG. 12 from the upper part (lower part) of the extension end of the source region 21 to the drain region end on the side of the drain region 23 under the bottom surface of the gate insulating film 25a (gate insulating film 25b). Thus, in the tunnel field-effect transistor 20, the upper limit (positive value) of $L_{TG}$ expressed in Formula (1) mentioned above is required to satisfy Inequality (5) instead of Inequality (2) mentioned above.

As for the lower limit of $L_{TG}$, since the tunnel field-effect transistor 10 has such a structure that the source region 1 comes in contact with the first gate part and the second gate part without being separated from each other, there is a need to satisfy the condition of Inequality (4) for the depletion of the source region 1. On the other hand, since the tunnel field-effect transistor 20 has such a structure that the source region 21 is separated from the first gate part and the second gate part with the part of the channel region 22 sandwiched therebetween, a tunnel with the interface between the support surface of the source region 21 and the channel region 22 set as the tunnel junction surface is generated regardless of the length of $L_{TG}$ to realize the ON state, there is no need to satisfy the condition of Inequality (4) mentioned above, and there is no limitation in principle as long as the condition of Inequality (3) mentioned above is satisfied.

Other Embodiments

While the first embodiment and the second embodiment have been described as embodiments of the tunnel field-effect transistors of the present invention, the present invention is not intended to limit the construction using any known structure other than those of the first embodiment and the second embodiment.

For example, a known TriGate structure (also called FINFET type) can be used as the structure of a tunnel field-effect transistor of the present invention.

Figure 13A:
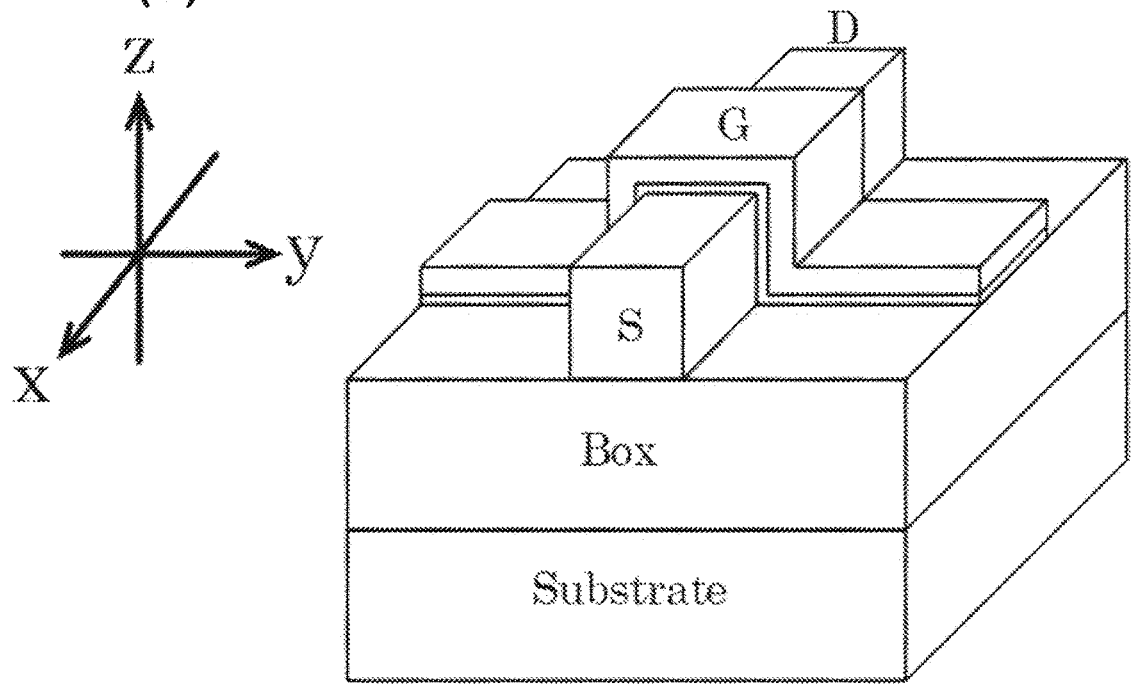
FIG. 13(a) is a perspective view illustrating an embodiment of a tunnel field-effect transistor having a TriGate structure.
Figure 13B:
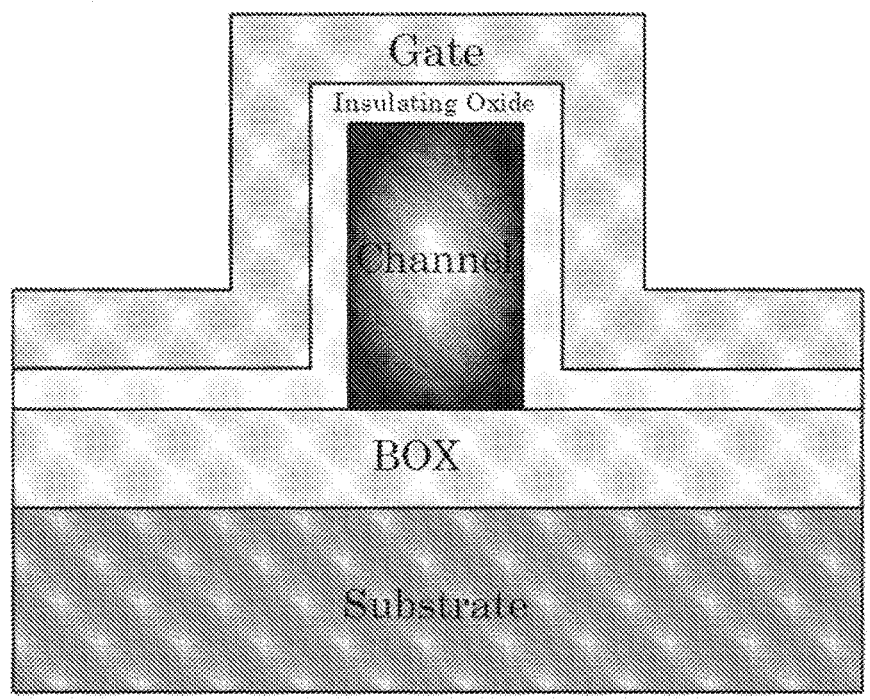
FIG. 13(b) is an explanatory view illustrating the main part of the transistor structure on a y-z plane in FIG. 13(a).
Figure 13C:
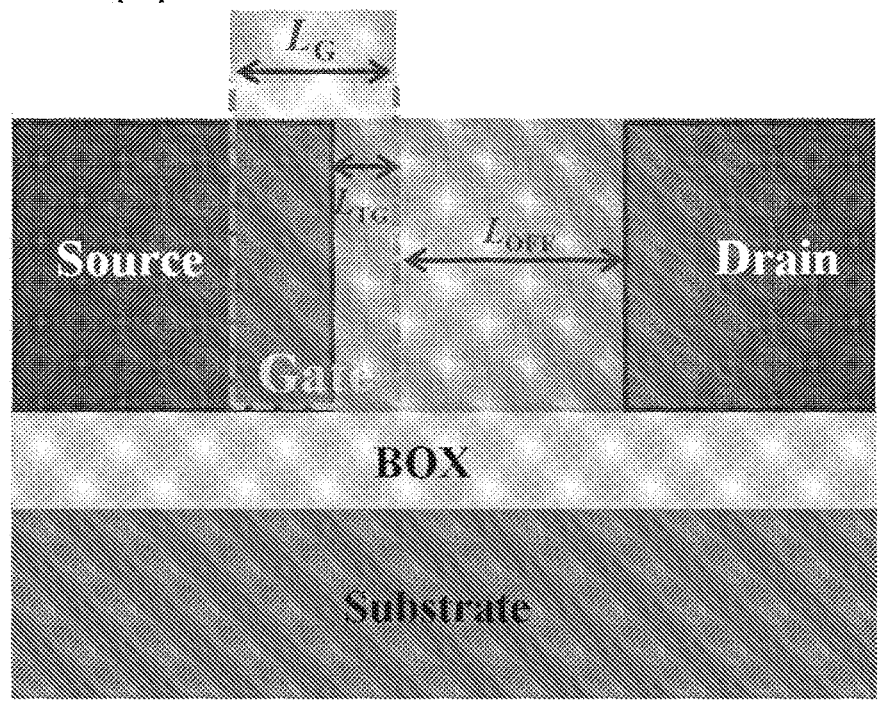
FIG. 13(c) is an explanatory view illustrating the main part of the transistor structure on an x-z plane in FIG. 13(a).

A structure example of using the TriGate structure is illustrated in FIG. 13(a) to FIG. 13(c). FIG. 13(a) is a perspective view illustrating an embodiment of a tunnel field-effect transistor having the TriGate structure, FIG. 13(b) is an explanatory view illustrating the main part of the transistor structure on a y-z plane in FIG. 13(a), and FIG. 13(c) is an explanatory view illustrating the main part of the transistor structure on an x-z plane in FIG. 13(a).

As illustrated in FIG. 13(a) to FIG. 13(c), even in the tunnel field-effect transistor having this TriGate structure, the positional relationship among a gate part, a source region, a channel region, and a drain region, which is common to that among the first gate part, the source region 1, the channel region 2, and the drain region 3 described in the first embodiment, can be adopted to set $L_{TG}$, and the effect of improving the drain current ON/OFF ratio can be obtained.

A known Gate-All-Around structure (GAA structure) can also be used as the structure of a tunnel field-effect transistor of the present invention.

Figure 14A:
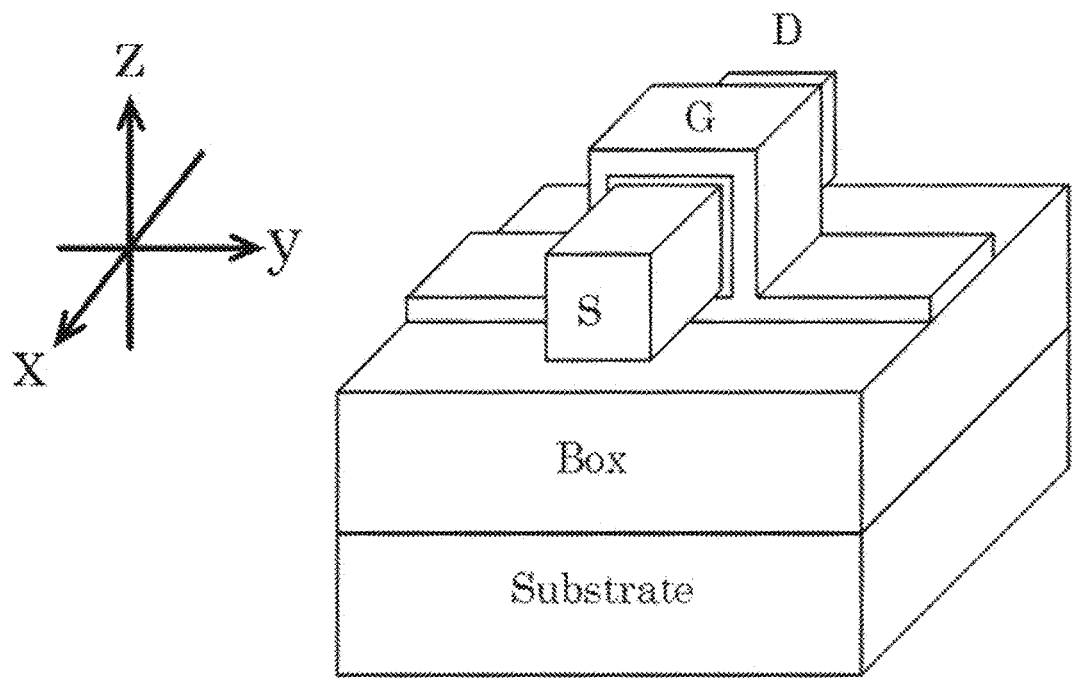
FIG. 14(a) is a perspective view illustrating an embodiment of a tunnel field-effect transistor having a GAA structure.
Figure 14B:
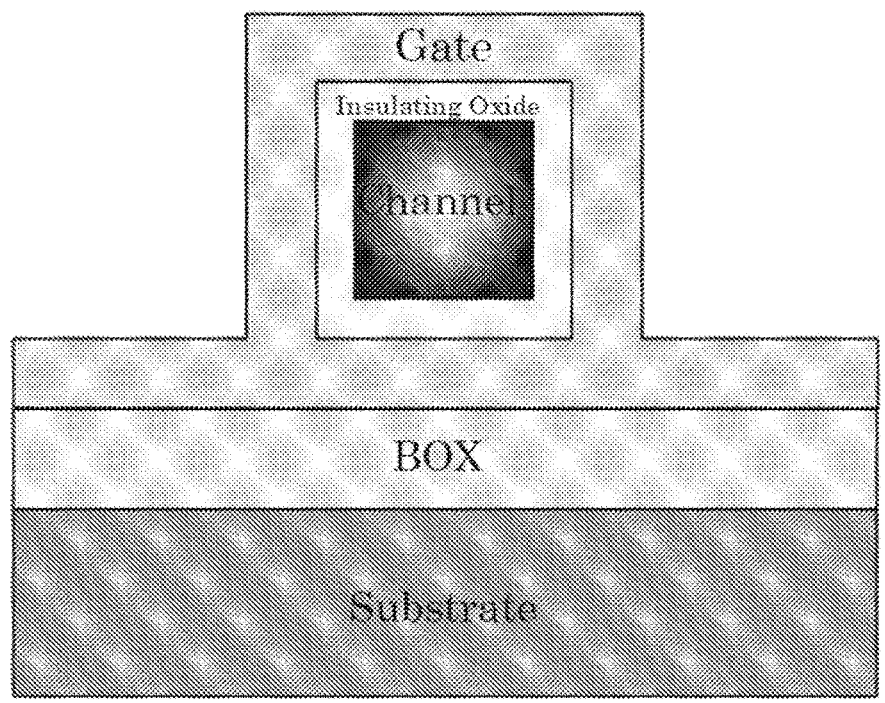
FIG. 14(b) is an explanatory view illustrating the main part of the transistor structure on the y-z plane in FIG. 14(a).
Figure 14C:
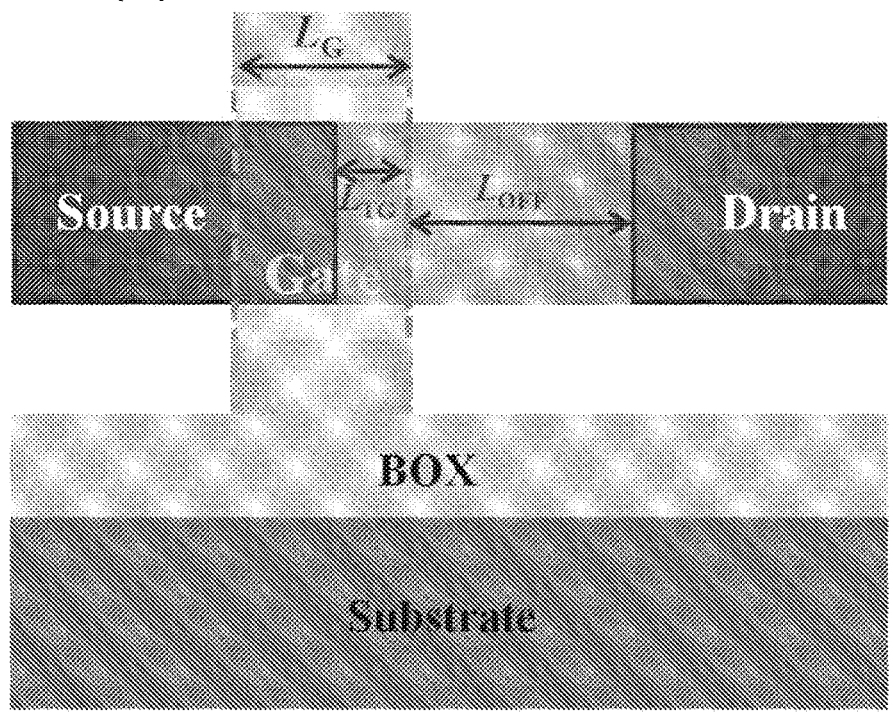
FIG. 14(c) is an explanatory view illustrating the main part of the transistor structure on the x-z plane in FIG. 14(a).

A structure example using the GAA structure is illustrated in FIG. 14(a) to FIG. 14(c). FIG. 14(a) is a perspective view illustrating an embodiment of a tunnel field-effect transistor having the GAA structure, FIG. 14(b) is an explanatory view illustrating the main part of the transistor structure on the y-z plane in FIG. 14(a), and FIG. 14(c) is an explanatory view illustrating the main part of the transistor structure on the x-z plane in FIG. 14(a).

As illustrated in FIGS. 14(a) to 14(c), even in the tunnel field-effect transistor having this GAA structure, the positional relationship among a first gate part, a second gate part, a source region, a channel region, and a drain region, which is common to that among the first gate part, the second gate part, the source region 1, the channel region 2, and the drain region 3 described in the first embodiment, can be adopted to set $L_{TG}$, and the effect of improving the drain current ON/OFF ratio can be obtained.

Further, a vertical Gate-All-Around structure (vertical GAA structure) can be used as the structure of a tunnel field-effect transistor of the present invention.

Figure 15A:
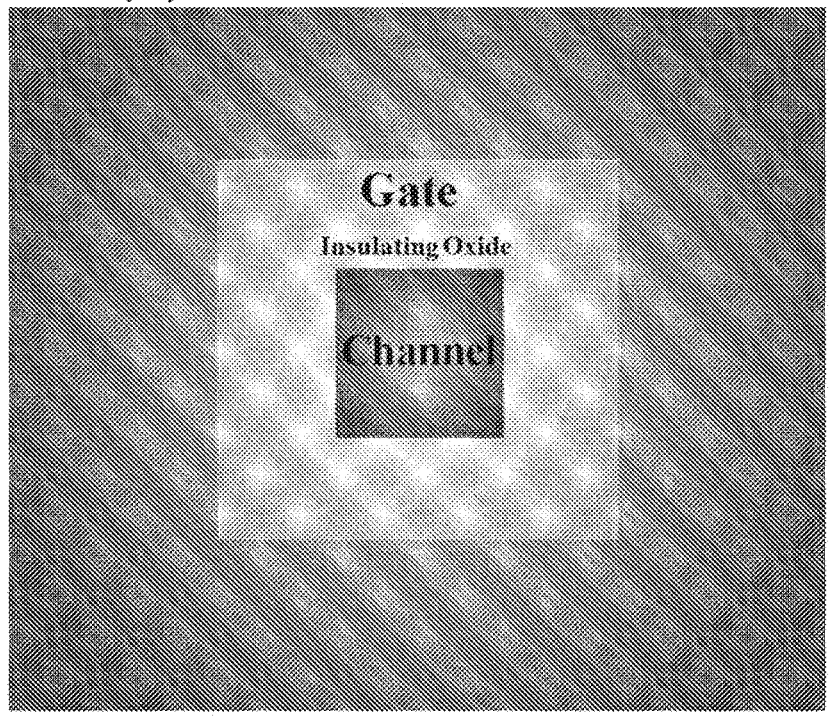
FIG. 15(a) is an explanatory view illustrating the main part of a transistor structure as a vertical GAA structure on a plane common to the x-y plane in FIG. 14(a).

The vertical GAA structure is a structure obtained by changing the GAA structure in which the source region and the drain region are formed along the x direction as illustrated in FIG. 14(a) in such a manner as to change the forming direction of the source region and the drain region to the z direction. FIG. 15(a) is an explanatory view illustrating the main part of the transistor structure on a plane common to the x-y plane in FIG. 14(a), and FIG. 15(b) is an explanatory view illustrating the main part of the transistor structure on a plane common to the y-z plane in FIG. 14(a).

Figure 15B:
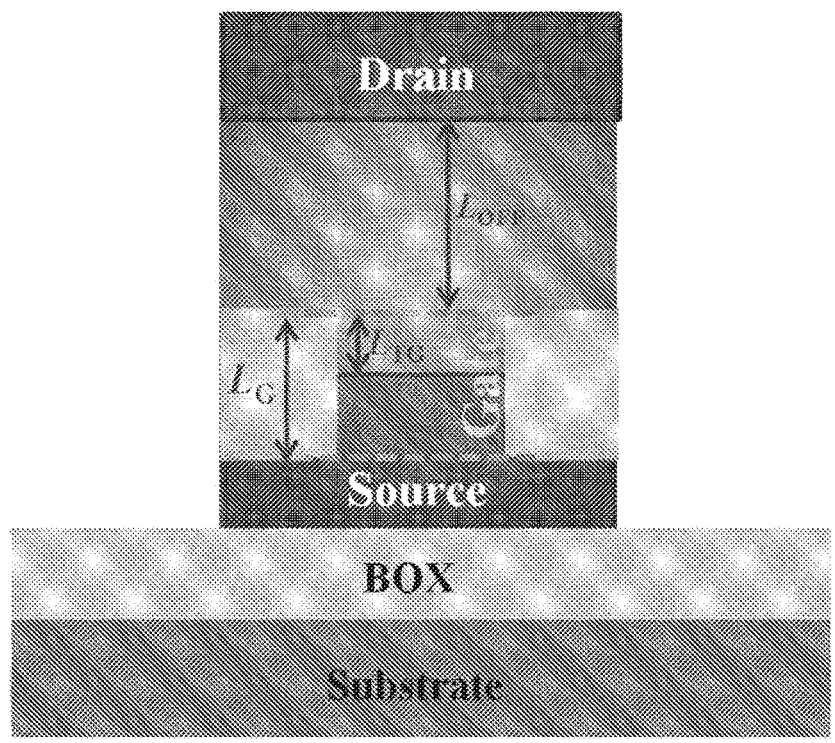
FIG. 15(b) is an explanatory view illustrating the main part of the transistor structure as the vertical GAA structure on a plane common to the y-z plane in FIG. 14(a).

As illustrated in FIG. 15(a) and FIG. 15(b), even in the vertical GAA structure, the positional relationship among a gate part, a source region, a channel region, and a drain region, which is common to that among the first gate part, the source region 1, the channel region 2, and the drain region 3 described in the first embodiment, can be adopted to set $L_{TG}$, and the effect of improving the drain current ON/OFF ratio can be obtained.

EXAMPLES

To verify the effects of the present invention, a TCAD (Technology Computer Aided Design) system (HyENEXSS) for semiconductor devices (transistors) was used to perform verification simulation tests on the drain current ON/OFF ratio of each of tunnel field-effect transistors.

Note that a TCAD system (HyENEXSS) in which a physical model related to a band-to-band tunneling model using the non-local electric field is incorporated was used.

Specifically, a method in which a tunnel path is determined from each of spatial distributions of the conduction band and the valence band according to Reference 3 below, and an average electric field (non-local electric field) on the tunnel path is calculated to calculate a tunnel rate G from Kane's formula below is adopted. See References 1 and 2 for the Kane's formula.

Reference 1: K. H. Kao et al., IEEE Trans. Electron Devices 59, 292 (2012)
Reference 2: Kane, J. Appl. Phys. 32, 83 (1961)
Reference 3: Fukuda et al., IWCE, pp. 1-4 (2014)

[Math. 34]

$$G = A \left(\frac{F}{F_0}\right)^P \exp\left(-\frac{B}{F}\right)$$

Note that A, B, and P in the formula denotes the physical parameters A, B, and P in the Kane's formula described respectively in Reference 1 mentioned above, and $F_0$ denotes the normalization constant.

(Simulation Test 1)

Figure 16:
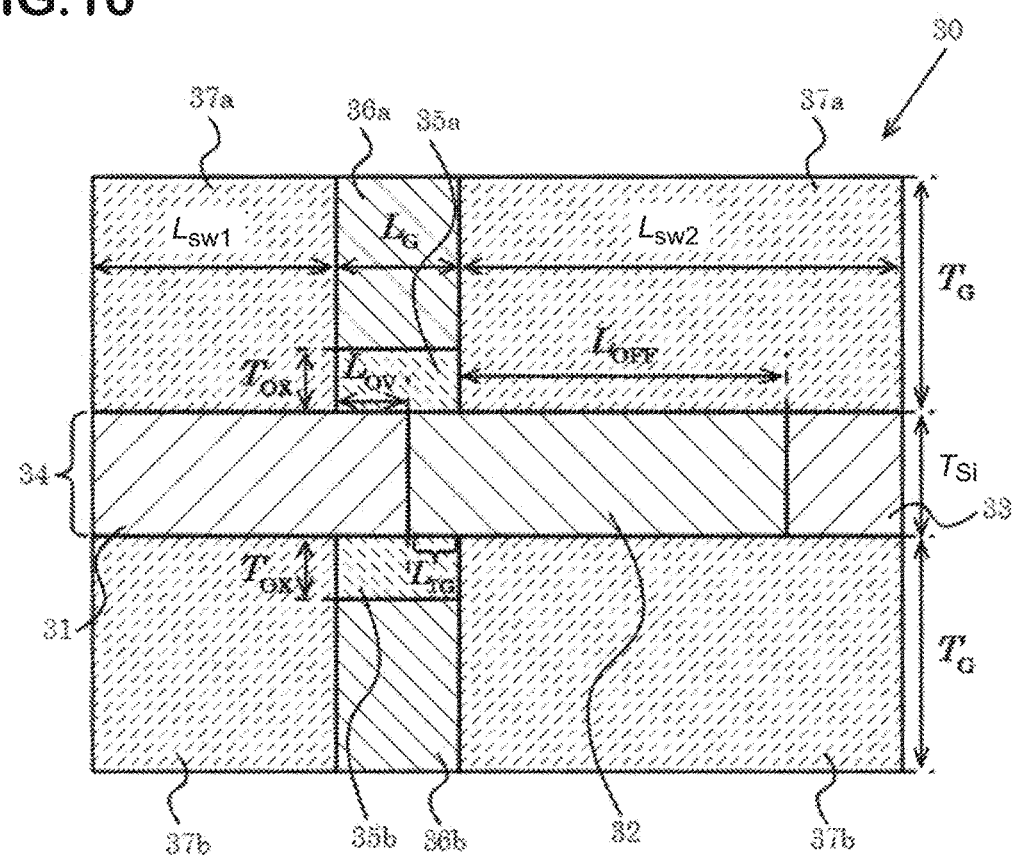
FIG. 16 is a view illustrating the structure of a double-gate type tunnel field-effect transistor on which Simulation Test 1 was performed.

As Simulation Test 1, a simulation test was performed on a double-gate type tunnel field-effect transistor 30 having a structure illustrated in FIG. 16. FIG. 16 is a view illustrating the structure of the double-gate type tunnel field-effect transistor on which the Simulation Test 1 was performed.

The details of respective parts are as follows.

A source region 31 is a P-type semiconductor region obtained by doping a P-type impurity into silicon at a concentration of $2 \times 10^{20}$ cm$^{-3}$.

A channel region 32 is a P-type semiconductor region obtained by doping a P-type impurity into silicon at a concentration of $2 \times 10^{18}$ cm$^{-3}$.

A drain region 33 is an N-type semiconductor region obtained by doping an N-type impurity into silicon at a concentration of $2 \times 10^{20}$ cm$^{-3}$.

The thickness of a semiconductor layer 34 ($T_{Si}$) is 10 nm. Gate insulating films 35a and 35b are formed of SiO$_2$, respectively, with the same width as the gate length ($L_G$) and a thickness ($T_{OX}$) of 0.8 nm.

Gate electrodes 36a and 36b are formed of Al. Further, a first gate part formed with the gate insulating film 35a and the gate electrode 36a, and a second gate part formed with the gate insulating film 35b and the gate electrode 36b have a common structure with a height ($T_G$) of 50 nm.

Here, the gate length ($L_G$) of each of the gate electrode 36a and 36b was changed in a range of 7 nm to 22 nm to perform the simulation test. In this context, the extension distance $L_{OV}$ of the source region 31 was set to 10 nm, $L_{TG}$ (=$L_G$-$L_{OV}$) expressed in Formula (1) was changed in a range of −3 nm to 12 nm, and a drain offset distance ($L_{OFF}$) was changed in a range of 73 nm to 58 nm.

Insulation parts 37a, 37b on the side of the source region 31 (on the left side of the figure) are formed of SiO$_2$, respectively, with a width ($L_{SW1}$) of 60 nm, and the height thereof is set equal to the height ($T_G$) of the first gate part and the second gate part.

The insulation part 37a, 37b on the side of the drain region 33 (on the right side of the figure) are formed of SiO$_2$, respectively, and a width ($L_{SW2}$) thereof was changed in a range of 93 nm to 78 nm along with the change in the gate length ($L_G$) with the height thereof set equal to the height ($T_G$) of the first gate part and the second gate part.

Note that the dimensions and structure of each part that is not involved in the change in the gate length ($L_G$) are set based on a standard tunnel field-effect transistor, respectively.

Further, parameters associated with the materials of the structure of the tunnel field-effect transistor 30 are set. Specifically, the parameters are as follows.

As the basic physical properties of Si, the following parameters were set:

Relative Permittivity: 11.7
Electron Affinity: 4.07 eV
Band Gap: 1.12 eV

The parameters A, B, P, and $F_0$ in the Kane's formula were set according to the structure of the tunnel field-effect transistor 30 as follows:

A: $4 \times 10^{14}$ cm$^{-3}$
B: 19 MV/cm
P: 2.5
$F_0$: 1 MV/cm

Then, the following was set in association with the mobility of carriers:

Lattice Scattering Mobility: Electron 1, 417 cm$^2$ V$^{--1}$ s$^{-1}$; Hall 470 cm$^2$ V$^{-1}$s$^{-1}$ A Masetti impurity-dependent model, a Scharfetter horizontal electric field model, and a Lombardi vertical electric field model were used.

As the basic physical properties of SiO$_2$, the following parameters were set:

Relative permittivity: 3.9
Electron Affinity: 0.97 eV
Band Gap: 9.0 eV

As the basic physical property of Al, the following parameter was set:

Work Function: 4.2 eV

Further, the operation of the tunnel field-effect transistor 30 was analyzed as follows.

From the calculation results based on the structure of the tunnel field-effect transistor 30, drain voltage VD was set to 0.3 V.

According to the definition of Approximate Expression (A) and from the analysis of the carrier distribution, the ON state current was determined as $1 \times 10^{-7}$ A/μm, and the OFF current was set to $1 \times 10^{-14}$ A/μm as $10^{-7}$ times of the ON state current.

According to the above conditions, a suitable range of $L_{TG}$ (=$L_G$-$L_{OV}$) expressed in Formula (1) is calculated as −1.75 nm<$L_{TG}$<11.3 nm based on Inequalities (2), (3), and (4) mentioned above.

Figure 17:
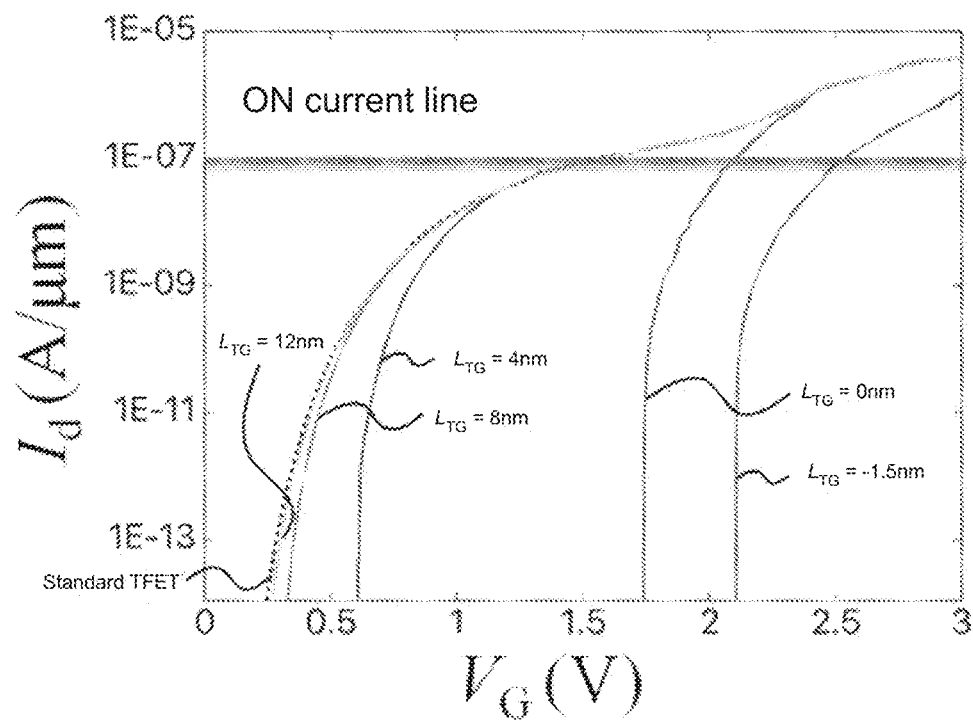
FIG. 17 is a graph illustrating the drain current $I_d$-gate voltage $V_G$ characteristics of the tunnel field-effect transistor 30.

The test results of Simulation Test 1 are illustrated in FIG. 17. FIG. 17 is a graph illustrating the drain current $I_d$-gate voltage $V_G$ characteristics of the tunnel field-effect transistor 30.

As for a case of out-of-suitable range of $L_{TG}$, when $L_{TG}$ is 12 nm as illustrated in FIG. 17, the drain current $I_d$-gate voltage $V_G$ characteristics similar to those of a standard tunnel field-effect transistor (Standard TFET) were obtained, and the improvement in the ON/OFF ratio was not confirmed. Further, when $L_{TG}$ is −3 nm, no increase in drain current $I_d$ was confirmed in a gate voltage $V_G$ range of 0 V to 3V and hence the ON state was not realized.

On the other hand, when $L_{TG}$ is each of −1.5 nm, 0 nm, 4 nm, and 8 nm included in the $L_{TG}$ suitable range, the rise in drain current $I_d$ is steep compared with the case of the standard tunnel field-effect transistor (Standard TFET) as illustrated in FIG. 17, and the improvement in the ON/OFF ratio is noticeable. It is also confirmed that the tunnel field-effect transistor 30 can be operated in a wide range of drive voltages $V_G$ depending on the setting of $L_{TG}$.

Further, in Simulation Test 1, any gate voltage is set as a reference gate voltage $V_{OFF}$ and calculated during a change of the gate voltage from the reference gate voltage $V_{OFF}$ to 0.1 V. Among average values ($s_{ave0.1V}$ values) of plural s values (subthreshold values) obtained in increments of 0.1 V according to the set value of the reference gate voltage $V_{OFF}$, the minimum value ($s_{ave0.1V\_min}$ value) is below 60 mV/decade to be indicated below. Note that this minimum value ($s_{ave0.1V\_min}$ value) indicates the steepest rise in drain current-gate voltage characteristics immediately before the tunnel field-effect transistor 30 switches to the ON state when the gate voltage is changed in increments of 0.1 V.

LTG: −1.5 nm
$s_{ave0.1V\_min}$ value: 21.3 mV/decade
LTG: 0 nm
$s_{ave0.1V\_min}$ value: 23.4 mV/decade
LTG: 4 nm $s_{ave0.1V\_min}$ value: 29.8 mV/decade
LTG: 8 nm
$s_{ave0.1V\_min}$ value: 38.5 mV/decade Further, in Simulation Test 1, any gate voltage is set as a reference gate voltage $V_{OFF}$ and calculated during a change of the gate voltage from the reference gate voltage $V_{OFF}$ to 0.01 V. Among plural s values ($s_{0.01V}$ values) obtained in increments of 0.01 V according to the set value of the reference gate voltage $V_{OFF}$, the minimum value ($s_{0.01V\_min}$ value) becomes a value shown below. Note that this minimum value ($s_{0.01\_Vmin}$ value) indicates the steepest rise in drain current-gate voltage characteristics immediately before the tunnel field-effect transistor 30 switches to the ON state when the gate voltage is changed in increments of 0.01 V, which represents the rise in drain current-gate voltage characteristics at finer voltage intervals compared with the above case of $s_{ave0.1V\_min}$ value.

LTG: −1.5 nm
$s_{0.01\_Vmin}$ value: 2.59 mV/decade
LTG: 0 nm
$s_{0.01\_Vmin}$ value: 2.82 mV/decade
LTG: 4 nm
$s_{0.01\_Vmin}$ value: 6.81 mV/decade
LTG: 8 nm
$s_{0.01\_Vmin}$ value: 21.3 mV/decade Thus, tunnel transistor of the present invention exhibits extremely steep current-voltage characteristics when the gate voltage reaches $V_{OFF}$, and the current value rises almost discontinuously with respect to the gate voltage.

(Simulation Test 2)

Figure 18:
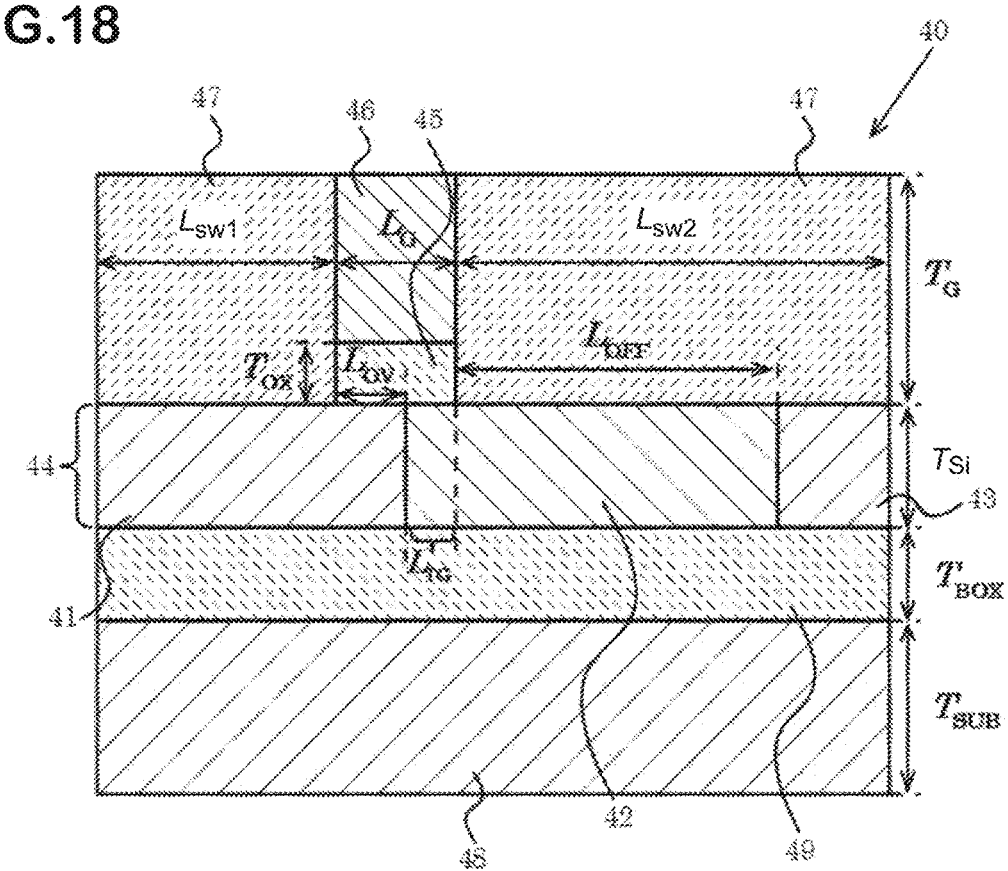
FIG. 18 is a view illustrating the structure of an SOI type tunnel field-effect transistor on which Simulation Test 2 was performed.

As Simulation Test 2, a simulation test was performed on an SOI type tunnel field-effect transistor 40 having a structure illustrated in FIG. 18. FIG. 18 is a view illustrating the structure of the SOI type tunnel field-effect transistor on which the Simulation Test 2 was performed.

The details of respective parts are as follows.

A channel region 42 is an N-type semiconductor region obtained by doping an N-type impurity into silicon at a concentration of $1 \times 10^{15}$ cm$^{-3}$.

The thickness ($T_{Si}$) of a semiconductor layer 44 is 20 nm.

A semiconductor substrate 48 is formed of Si with a thickness ($T_{SUB}$) of 200 nm.

A BOX layer 49 is formed of SiO$_2$ with a thickness ($T_{Box}$) of 145 nm.

The other parts of the tunnel field-effect transistor 40, that is, a source region 41, a drain region 43, a gate insulating film 45, a gate electrode 46, and an insulation part 47 are set equal to the source region 31, the drain region 33, the gate insulating film 35a, the gate electrode 36a, and the insulation part 37a of the tunnel field-effect transistor 30, respectively, and the various dimensions ($T_{OX}$, $T_G$, $L_G$, $L_{OV}$, $L_{OFF}$, $L_{SW1}$, $L_{SW2}$) are set equal to those of the tunnel field-effect transistor 30.

Further, parameters associated with the materials of the structure of the tunnel field-effect transistor 40 are set equal to the parameters associated with the materials of the structure of the tunnel field-effect transistor 30.

Further, the operation of the tunnel field-effect transistor 40 was analyzed as follows.

From the calculation results based on the structure of the tunnel field-effect transistor 40, drain voltage $V_D$ was set to 0.3 V.

According to the definition of Approximate Expression (A) and from the analysis of the carrier distribution, the ON state current was determined as $1 \times 10^{-7}$ A/μm and the OFF current was set to $1 \times 10^{-14}$ A/μm as $10^{-7}$ times of the ON state current.

According to the above conditions, a suitable range of $L_{TG}$ (=$L_G$−$L_{OV}$) expressed in Formula (1) is calculated as −1.75 nm<$L_{TG}$<11.3 nm based on Inequalities (2), (3), and (4) mentioned above.

Note that the operating characteristics of the tunnel field-effect transistor 40 and the suitable range of $L_{TG}$ are set common to those of the tunnel field-effect transistor 30.

Figure 19:
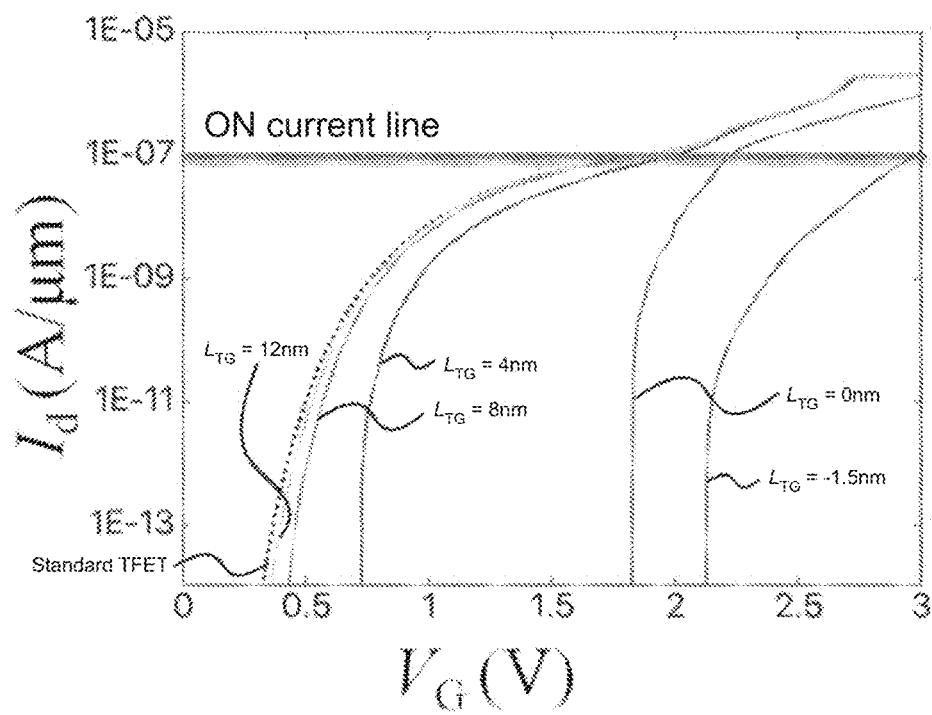
FIG. 19 is a graph illustrating the drain current $I_d$-gate voltage $V_G$ characteristics of a tunnel field-effect transistor 40.

The test results of Simulation Test 2 are illustrated in FIG. 19. FIG. 19 is a graph illustrating the drain current $I_d$-gate voltage $V_G$ characteristics of the tunnel field-effect transistor 40.

As for a case of out-of-suitable range of $L_{TG}$, when $L_{TG}$ is 12 nm as illustrated in FIG. 19, the drain current $I_d$-gate voltage $V_G$ characteristics similar to those of a standard tunnel field-effect transistor (Standard TFET) were obtained, and the improvement in the ON/OFF ratio was not confirmed. Further, when $L_{TG}$ is −3 nm, no increase in drain current $I_d$ was confirmed in a gate voltage $V_G$ range of 0 V to 3V and hence the ON state was not realized.

On the other hand, when $L_{TG}$ is each of −1.5 nm, 0 nm, 4 nm, and 8 nm included in the $L_{TG}$ suitable range, the rise in drain current $I_d$ is steep compared with the case of the standard tunnel field-effect transistor (Standard TFET) as illustrated in FIG. 19, and the improvement in the ON/OFF ratio is noticeable. It is also confirmed that the tunnel field-effect transistor 40 can be operated in a wide range of gate voltages $V_G$ depending on the setting of $L_{TG}$.

Further, in Simulation Test 2, any gate voltage is set as a reference gate voltage $V_{OFF}$ and calculated during a change of the gate voltage from the reference gate voltage $V_{OFF}$ to 0.1 V. Among average values ($s_{ave0.1V}$ values) of plural s values obtained in increments of 0.1 V according to the set value of the reference gate voltage $V_{OFF}$, the minimum value ($s_{ave0.1V\_min}$ value) is below 60 mV/decade to be indicated below.

LTG: −1.5 nm
$s_{ave0.1V\_min}$ value: 29.4 mV/decade
LTG: 0 nm
$s_{ave0.1V\_min}$ value: 19.3 mV/decade
LTG: 4 nm
$s_{ave0.1V\_min}$ value: 25.5 mV/decade
$L_{TG}$: 8 nm
$s_{ave0.1V\_min}$ value: 46.5 mV/decade Further, in Simulation Test 2, any gate voltage is set as a reference gate voltage $V_{OFF}$ and calculated during a change of the gate voltage from the reference gate voltage $V_{OFF}$ to 0.01 V. Among plural s values ($s_{0.01V}$ values) obtained in increments of 0.01 V according to the set value of the reference gate voltage $V_{OFF}$, the minimum value ($s_{0.01V\_min}$ value) becomes a value shown below.

LTG: −1.5 nm
$s_{0.01\_Vmin}$ value: 5.00 mV/decade
LTG: 0 nm
$s_{0.01\_Vmin}$ value: 2.91 mV/decade
LTG: 4 nm
$s_{0.01\_Vmin}$ value: 5.12 mV/decade
LTG: 8 nm
$s_{0.01\_V\_min}$ value: 30.0 mV/decade These results are the same as those of the tunnel field-effect transistor 30, and the effect of improving the ON/OFF ratio due to the LTG setting is confirmed in both the double-gate structure and the SOI structure.

(Simulation Test 3)

Simulation test 3 was performed on a tunnel field-effect transistor set in the same manner as the tunnel field-effect transistor 40 except for the following change points: the forming material of the semiconductor layer 44 (source region 41, channel region 42, drain region 43) and the semiconductor substrate 48 was changed from Si to Ge, the thickness ($T_{OX}$) of the gate insulating film was changed from 0.8 nm to 1.2 nm, $L_G$ was changed in a range of 7 nm to 35 nm instead of the range of 7 nm to 22 nm, and $L_{SW2}$ was changed in a range of 93 nm to 65 nm, instead of the range of 93 nm to 78 nm, along with the change in changing range of $L_G$, and the $L_{OFF}$ was changed in a range of 73 nm to 45 nm instead of the range of 73 nm to 58 nm.

In the tunnel field-effect transistor on which Simulation Test 3 was performed, parameters associated with the materials of the structure were set as follows.

As the basic physical properties of Ge, the following parameters were set:
Relative Permittivity: 16.2
Electron Affinity: 4.0 eV
Band Gap: 0.66 eV
The parameters A, B, P, and $F_0$ in the Kane's formula were set as follows:
A: $4.55 \times 10^{16}$ cm$^{-3}$
B: 4.9 MV/cm
P: 2.5
$F_0$: 1 MV/cm
Since the other parameters are the same as those when the forming material of the semiconductor layer and the semiconductor substrate is Si, the same parameters as those in Simulation Test 2 were set.

The operation of the tunnel field-effect transistor on which Simulation Test 3 was performed was analyzed as follows.

From the calculation results based on the structure of the tunnel field-effect transistor of this test, the drain voltage $V_D$ was set to 0.01 V.

According to the definition of Approximate Expression (A) and from the analysis of the carrier distribution, the ON state current was determined as $1 \times 10^{-6}$ A/μm, and the OFF current was set to $1 \times 10^{-13}$ A/μm as $10^{-7}$ times of the ON state current.

According to the above conditions, a suitable range of $L_{TG}$ ($=L_G-L_{OV}$) expressed in Formula (1) is calculated as $-2.62$ nm $<L_{TG}<23.4$ nm based on Inequalities (2), (3), and (4) mentioned above.

Figure 20:
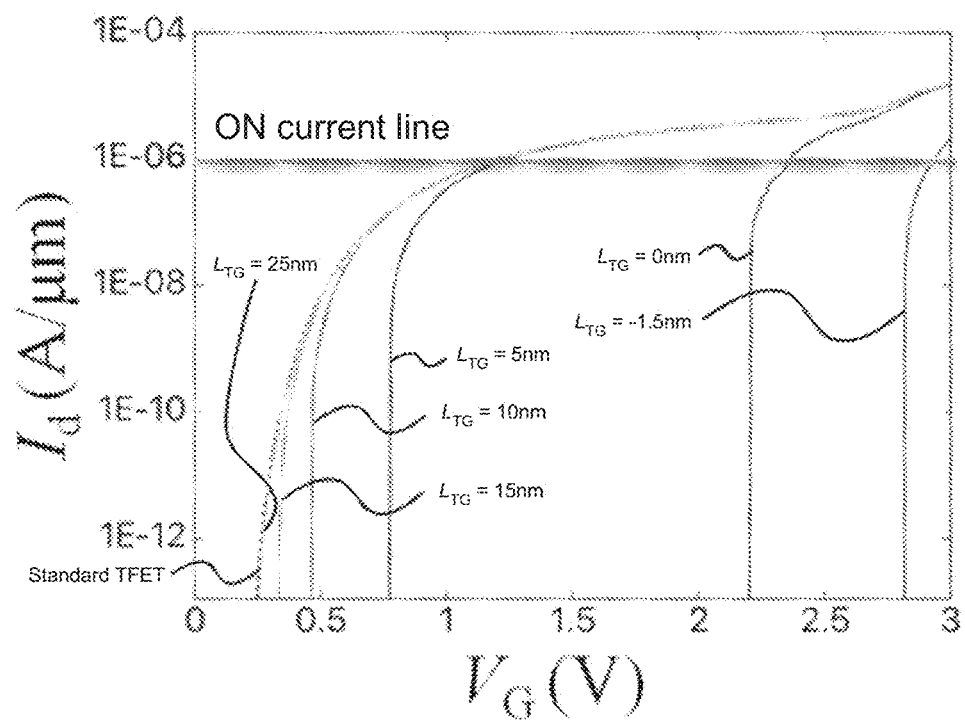
FIG. 20 is a graph illustrating the drain current $I_d$-gate voltage $V_G$ characteristics of a tunnel field-effect transistor on which Simulation Test 3 was performed.

The test results of Simulation Test 3 are illustrated in FIG. 20. FIG. 20 is a graph illustrating the drain current $I_d$-gate voltage $V_G$ characteristics of the tunnel field-effect transistor on which Simulation Test 3 was performed.

As for a case of out-of-suitable range of $L_{TG}$, when $L_{TG}$ is 25 nm as illustrated in FIG. 20, the drain current $I_d$-gate voltage $V_G$ characteristics similar to those of the standard tunnel field-effect transistor (Standard TFET) were obtained, and the improvement in the ON/OFF ratio was not confirmed. Further, when $L_{TG}$ is $-3$ nm, no increase in drain current $I_d$ was confirmed in a gate voltage $V_G$ range of 0 V to 3V and hence the ON state was not realized.

On the other hand, when $L_{TG}$ is each of $-1.5$ nm, 0 nm, 5 nm, 10 nm, and 15 nm included in the $L_{TG}$ suitable range, the rise in drain current $I_d$ is steep compared with the case of the standard tunnel field-effect transistor (Standard TFET) as illustrated in FIG. 20, and the improvement in the ON/OFF ratio is noticeable. It is also confirmed that the tunnel field-effect transistor of this Simulation Test can be operated in a wide range of gate voltages $V_G$ depending on the setting of $L_{TG}$.

Further, in Simulation Test 3, any gate voltage is set as a reference gate voltage $V_{OFF}$ and calculated during a change of the gate voltage from the reference gate voltage $V_{OFF}$ to 0.1 V. Among average values ($s_{ave0.1V}$ values) of plural s values obtained in increments of 0.1 V according to the set value of the reference gate voltage $V_{OFF}$, the minimum value ($s_{ave0.1V\_min}$ value) is below 60 mV/decade to be indicated below.

$L_{TG}$: $-1.5$ nm
  $s_{ave0.1V\_min}$ value: 14.6 mV/decade
$L_{TG}$: 0 nm
  $s_{ave0.1V\_min}$ value: 14.9 mV/decade
LTG: 5 nm
  $s_{ave0.1V\_min}$ value: 16.9 mV/decade
LTG: 10 nm
  $s_{ave0.1V\_min}$ value: 19.8 mV/decade
LTG: 15 nm
  $s_{ave0.1V\_min}$ value: 20.0 mV/decade Further, in Simulation Test 3, any gate voltage is set as a reference gate voltage $V_{OFF}$ and calculated during a change of the gate voltage from the reference gate voltage $V_{OFF}$ to 0.01 V. Among plural s values ($s_{0.01V}$ values) obtained in increments of 0.01 V according to the set value of the reference gate voltage $V_{OFF}$, the minimum value ($s_{0.01V\_min}$ value) becomes a value shown below.

$L_{TG}$: $-1.5$ nm
  $s_{0.01V\_min}$ value: 1.76 mV/decade
$L_{TG}$: 0 nm
  $s_{0.01V\_min}$ value: 1.76 mV/decade
LTG: 5 nm
  $s_{0.01V\_min}$ value: 2.32 mV/decade
LTG: 10 nm
  $s_{0.01V\_min}$ value: 2.95 mV/decade
LTG: 15 nm
  $s_{0.01V\_min}$ value: 6.41 mV/decade Thus, even when the forming material of the semiconductor layer and the semiconductor substrate is changed from Si to another forming material (Ge), it is confirmed that the improvement of the ON/OFF ratio due to the setting of $L_{TG}$ can be obtained.

Working Example 1

A tunnel field-effect transistor according to Working Example 1 as the tunnel field-effect transistor of the SOI structure was manufactured as follows.

First, an SOI wafer (obtained by downsizing a wafer made by Soitec (France) to 2 inches) formed with an $SiO_2$ insulation layer of 400 nm thick and a P-type silicon layer doped with Boron (B) as a P-type impurity of 50 nm thick at a concentration of about $1 \times 10^{15}$ cm$^{-3}$ stacked in this order on a handling Si layer was prepared.

Next, the P-type silicon layer of the SOI wafer was oxidized by using thermal oxide film forming equipment (VL-3000LP manufactured by Koyo Thermo Systems Co. Ltd.) to form a protective oxide film of 4 nm thick.

Next, a negative resist (SAL601A made by Rohm & Hass Co.) was coated on the protective oxide film using electron beam lithography equipment (ELS-F130AN manufactured by Elionix Inc.) to form a resist pattern of about 200 nm thick.

Next, the resist pattern was used as a mask and an ion implanter (SHX manufactured by Sumitomo Heavy Industries, Ltd.) was used to implant As ions using solid As as the ion source into the P-type silicon layer with an acceleration energy of 5 keV and by a dose amount of about $2 \times 10^{15}$ cm$^{-2}$ to form an N+ type source region in one region of the P-type silicon layer.

Next, the resist pattern was removed by oxygen ashing treatment using oxygen ashing equipment (PACK-I manufactured by Plasma Systems Inc.), the surface (the surface of the protective oxide film) after the resist pattern was removed was cleaned by cleaning treatment with fuming sulfuric acid and further chemical cleaning was done using a cleaning liquid (EKC683 made by DuPont).

Next, a P+ type drain region was formed in a position to face the source region in the P-type silicon layer. The drain region was formed in the same manner as the method of forming the source region from the ion implantation to the chemical cleaning except that As ions using solid As as the ion source were changed to B ions using $BF_2$ gas as the ion source.

Next, rapid annealing equipment (RTP manufactured by Advance Riko Inc.) was used to perform activation annealing treatment for one second at 1,000° C. under the atmospheric pressure of $N_2$ gas in order to activate each of the impurities in the source region and the drain region, respectively.

During the activation annealing treatment, each of the impurities is thermally diffused to cause the source region to extend by 5 nm toward the drain region more than during the ion implantation. Similarly, the drain region extends by 5 nm toward the source region more than during the ion implantation. In the following, a position of the source region to get closest to the drain region after the activation annealing treatment is set as a source end, and a position of the drain region to get closest to the source region is set as a drain end.

Further, a remaining region other than the source region and the drain region in the P-type silicon layer after the activation annealing treatment is a channel region.

Next, the protective oxide film was removed by using dilute hydrofluoric acid (DHF) at a concentration of 1%.

Next, SC2 cleaning liquid (a liquid mixture of HCl and $H_2O_2$) was used to perform cleaning on the surface after the protective oxide film was removed (each of the surfaces of the P-type silicon layer, the source region, and the drain region) for five minutes under the temperature condition of 80° C. Note that an $SiO_2$ film of 1 nm deep is formed on the surface at this moment.

Next, ALD equipment (Triase manufactured by Tokyo Electron Limited) was used to deposit $HfO_2$ on the $SiO_2$ film under the temperature condition of 250° C. in order to form an $HfO_2$ film of 4 nm thick. The $SiO_2$ film and the $HfO_2$ film constitute a gate insulating film.

Next, a TaN layer of 10 nm thick was formed on the gate insulating film by helicon sputtering using sputtering equipment (i-sputter manufactured by ULVAC Inc.). The TaN layer constitutes a gate electrode.

As described above, in the tunnel field-effect transistor of the present invention, the positional relationship between the extension end of the source region and the side face of the gate electrode on the side of the drain region is important. At the present stage, the gate electrode is formed as a uniform layer, and the side face of the gate electrode on the side of the drain region is formed at a desired position by performing the following gate processing on the gate electrode.

First, $SiO_2$ was deposited on the layered gate electrode by using CVD equipment (i-220-ME manufactured by SUMCO corp.) to form a hard mask layer of 40 nm thick.

Next, the negative resist was coated on the hard mask layer by using the electron beam lithography equipment to form a gate resist pattern of about 200 nm thick.

Here, the gate resist pattern is to control the gate length ($L_G$) and formation position of the gate electrode after being subjected to the gate processing in such a manner that the width is set to the same length as the gate length ($L_G$=60 nm) of the gate electrode after being subjected to the gate processing, the formation position is positioned to make $L_{OV}$ expressed in Formula (1) and set depending on the formation position of the gate electrode after being subjected to the gate processing become 55 nm and to make $L_{TG}$ expressed in Formula (1) become 5 nm ($L_{TG}=L_G-L_{OV}$), and further the formation position is positioned to make $L_{OFF}$ in Inequality (3) become 45 nm at the same time.

Next, reactive-ion etching treatment using $CHF_3$ gas as etching gas was performed by using reactive-ion etching equipment (CE-3300R manufactured by ULVAC Inc.) to remove the remaining part of the hard mask layer excluding the part directly under the gate resist pattern.

Next, after cleaning using a first cleaning liquid (EBR10A made by Rohm & Hass Co.), cleaning using a second cleaning liquid (EKC683 made by DuPont) was performed to remove the gate resist pattern.

Next, the gate processing was performed on the gate electrode and the gate insulating film by reactive-ion etching treatment using the reactive-ion etching equipment with the hard mask layer as a mask and $Cl_2$ gas as etching gas.

Next, the hard mask layer remaining on the gate electrode was removed by using dilute hydrofluoric acid at the concentration of 1%.

Finally, the tunnel field-effect transistor according to Working Example 1 was obtained after conventional manufacturing processes including the installation of metal wiring, the formation of an interlayer insulating layer using $SiO_2$ as the forming material, and hydrogen annealing treatment for 30 minutes at 400° C.

In the tunnel field-effect transistor according to Working Example 1, $L_G$, $L_{OV}$, and $L_{TG}$ in Formula (1) mentioned above are set as follows:

$L_G$: 60 nm
$L_{OV}$: 55 nm
$L_{TG}$: 5 nm

Further, in the tunnel field-effect transistor according to Working Example 1, required $R_{ONOFF}$ is set to $10^7$ and $l_{t\_OFF}$ is estimated as 11.3 nm based on Formula (H) mentioned above.

Thus, in the tunnel field-effect transistor according to Working Example 1, $L_{TG} < l_{t\_OFF}$ (5 nm<11.3 nm) is set to satisfy the condition of Inequality (2) mentioned above.

Further, in the tunnel field-effect transistor according to Working Example 1, $L_{direct}$ and $L_{OFF}$ in Inequality (3) mentioned above are set based on the formation positions of the source region, the drain region, and the channel region with respect to the P-type silicon layer as follows:

$L_{direct}$: 30 nm
$L_{OFF}$: 45 nm

Thus, in the tunnel field-effect transistor according to Working Example 1, $L_{TG} > L_{direct} - L_{OFF}$ (5 nm>30 nm-45 nm) is set to satisfy the condition of Inequality (3) mentioned above.

Comparative Example 1

In the manufacturing of the tunnel field-effect transistor according to Working Example 1, a tunnel field-effect transistor according to Comparative Example 1 was obtained in the same manufacturing process as the tunnel field-effect transistor according to Working Example 1 except that the formation position of the gate resist pattern was changed to set $L_G$, $L_{OV}$, and $L_{TG}$ in Formula (1) mentioned above as follows:

$L_G$: 80 nm
$L_{OV}$: 55 nm
$L_{TG}$: 25 nm

In the tunnel field-effect transistor according to Comparative Example 1, $L_{TG} > l_{t\_OFF}$ (25 nm>11.3 nm) is set, which is different from that of the tunnel field-effect transistor according to Working Example 1 in that the condition of Inequality (2) is not satisfied.

(Measurement of Drain Current-Gate Voltage Characteristics)

Both of the tunnel field-effect transistors according to Working Example 1 and Comparative Example 1 relate to tunnel field-effect transistors that exhibit P-type operation.

The drain current-gate voltage characteristics of the respective tunnel field-effect transistors according to Working Example 1 and Comparative Example 1 were measured by using a semiconductor parameter analyzer (S4200 manufactured by Keithley) at room temperature.

Specifically, measurements were made by a 4-terminal measurement method in which terminals were connected to the gate electrode, the drain region, the source region, and the handling Si layer with the source region and the handling Si layer grounded to sweep the gate voltage at the gate electrode from −2.0 V to 0.5 V at intervals of 0.05 V while applying a drain voltage of −0.2 V to the drain region in order to measure the drain current.

Figure 21:
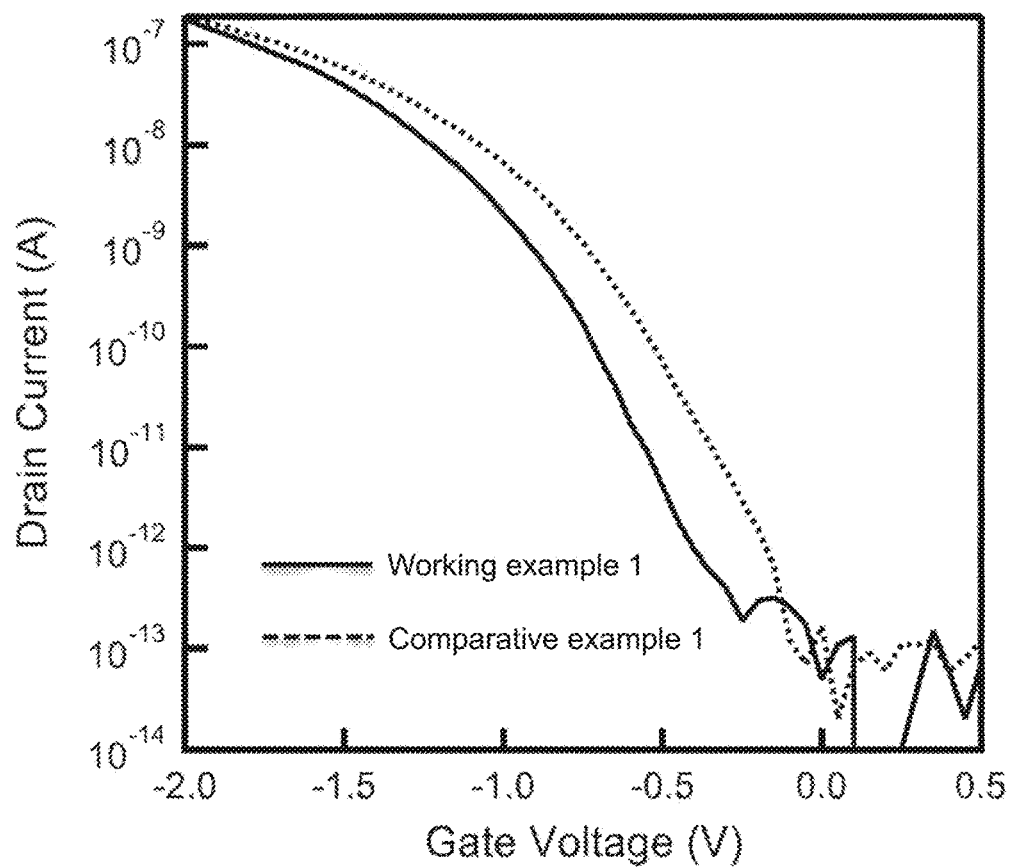
FIG. 21 is a graph illustrating the measurement results of the drain current-gate voltage characteristics of respective tunnel field-effect transistors according to Working Example 1 and Comparative Example 1.

The measurement results of the drain current-gate voltage characteristics of the respective tunnel field-effect transistors according to Working Example 1 and Comparative Example 1 are illustrated together in FIG. 21. Although the drain current is operated in a negative-value region in the tunnel field-effect transistors that exhibit P-type operation, the drain current is represented as the absolute value in FIG. 21.

As illustrated in FIG. 21, the tunnel field-effect transistor according to Working Example 1 exhibits a larger change in drain current with respect to the change in gate voltage from −2.0 V to −0.25 V than the tunnel field-effect transistor according to Comparative Example 1, thus obtaining a steep drain current ON/OFF ratio characteristics.

DESCRIPTION OF REFERENCE NUMERALS 1, 21, 31, 41, 101 source region
1' depletion layer
2, 22, 32, 42, 102 channel region
2' accumulation layer
3, 23, 33, 43, 103 drain region
4, 24, 34, 44, 104 semiconductor layer
5a, 5b, 25a, 25b, 35a, 35b, 45, 105a, 105b gate insulating film
6a, 6b, 26a, 26b, 36a, 36b, 46, 106a, 106b gate electrode
7a, 7b, 27a, 27b, 37a, 37b, 47, 107a, 107b insulation part
10, 20, 30, 40, 100 tunnel field-effect transistor
48 semiconductor substrate
49 BOX layer

The invention claimed is:

1. A tunnel field-effect transistor comprising: a semiconductor layer formed to include a source region, a channel region arranged adjacent to the source region and whose boundary surface with the source region is set as a tunnel junction surface to cause carriers in the source region to tunnel through, and a drain region arranged adjacent to the channel region and to which the carriers are transported from the channel region; a gate part formed with a gate insulating film and a gate electrode arranged in this order on the semiconductor layer; and an insulation part arranged to cover a side face of the gate electrode, and having: a structure in which part of the source region is arranged under a bottom surface of the gate part as a surface on a side of the gate insulating film to cause the bottom surface and the part of the source region to come into contact with each other; and a drain offset structure in which a drain offset region is formed in the semiconductor layer to keep the gate electrode and the drain region away from each other, wherein when a gate length as a width of the gate electrode in a direction parallel to a channel direction between the source region and the drain region is denoted by $L_G$, and an extension distance of the source region extended toward the drain region in a direction parallel to the channel direction from a position in the source region opposite in a height direction of the gate electrode to a source-side reference position as a side face position of the gate electrode closest to the source region is denoted by $L_{OV}$, $L_{TG}$ expressed in Formula (1) below as a shortest distance between a position of an extension end of the source region, which is most extended toward the drain region based on a side face position of the gate electrode closest to the drain region and set as a drain-side reference position, and a position in the semiconductor layer opposite in the height direction of the gate electrode to the drain-side reference position satisfies respective conditions of Inequality (2) and Inequality (3) below,

[Math. 1]

$$L_{TG} = L_G - L_{OV} \tag{1}$$

[Math. 2]

$$L_{TG} < l_{t\_OFF} \tag{2}$$

[Math. 3]

$$L_{TG} > L_{direct} - L_{OFF} \tag{3}$$

where $l_{t\_OFF}$ in Inequality (2) denotes a shortest tunnel distance over which the carriers move from the source region to the channel region through the tunnel junction surface in an OFF state of the tunnel field-effect transistor, and in Inequality (3), $L_{direct}$ denotes a shortest distance between the source region and the drain region to regulate a direct tunnel through which the carriers move between the source region and the drain region by forming a tunnel path to connect the source region and the drain region, and $L_{OFF}$ denotes a drain offset length to regulate a length of the channel direction in the drain offset region.

2. The tunnel field-effect transistor according to claim 1, wherein $L_{TG}$ further satisfies a condition of Inequity (4) below,

[Math. 4]

$$L_{TG} > -T_{OX}\sqrt{\frac{4\epsilon_{SW}^2 \beta^2}{\epsilon_{OX}^2} - 1} \tag{4}$$

where in Inequality (4), $T_{OX}$ denotes a thickness of the gate insulating film, $\epsilon_{OX}$ denotes a relative permittivity of a forming material of the gate insulating film, $\epsilon_{SW}$ denotes a relative permittivity of a forming material of the insulation part, and $\beta$ denotes an amplification factor of an electric field due to an electric field concentration at a position of the extension end of the source region.

3. The tunnel field-effect transistor according to claim 1, wherein a forming material of the semiconductor layer is either one of Si and Ge.

4. The tunnel field-effect transistor according to claim 1, wherein the tunnel field-effect transistor has either a double-gate structure, in which gate parts are arranged in positions opposite to each other on a top surface and a bottom surface of the semiconductor layer, respectively, or an SOI structure in which the semiconductor layer and the gate part are arranged in this order on a silicon oxide film.

5. A tunnel field-effect transistor comprising: a semiconductor layer formed to include a source region, a channel region arranged adjacent to the source region and whose boundary surface with the source region is set as a tunnel junction surface to cause carriers in the source region to tunnel through, and a drain region arranged adjacent to the channel region and to which the carriers are transported from the channel region; a gate part formed with a gate insulating film and a gate electrode arranged in this order on the semiconductor layer; and an insulation part arranged to cover a side face of the gate electrode, and having: a structure in which part of the channel region and part of the source region with a support surface formed with respect to the part of the channel region as a surface parallel to a bottom surface of the gate part as a surface on a side of the gate insulating film are arranged in this order under the bottom surface to cause the part of the channel region to separate the bottom surface and the support surface from each other; and a drain offset structure in which a drain offset region is formed in the semiconductor layer to keep the gate electrode and the drain region away from each other, wherein when a gate length as a width of the gate electrode in a direction parallel to a channel direction between the source region and the drain region is denoted by $L_G$, and an extension distance of the source region extended toward the drain region in a direction parallel to the channel direction from a position in the source region opposite in a height direction of the gate electrode to a source-side reference position as a side face position of the gate electrode closest to the source region is denoted by $L_{OV}$, $L_{TG}$ expressed in Formula (1) below as a shortest distance between a position of an extension end of the source region, which is most extended toward the drain region based on a side face position of the gate electrode closest to the drain region and set as a drain-side reference position, and a position in the semiconductor layer opposite in the height direction of the gate electrode to the drain-side reference position satisfies respective conditions of Inequality (3) and Inequality (5) below,

[Math. 5]

$$L_{TG}=L_G-L_{OV} \qquad (1)$$

[Math. 6]

$$L_{TG}>L_{direct}-L_{OFF} \qquad (3)$$

[Math. 7]

$$L_{TG}<\sqrt{l_{t\_OFF}^2-T_{EPI}^2} \qquad (5)$$

where in Inequality (3), $L_{direct}$ denotes a shortest distance between the source region and the drain region to regulate a direct tunnel through which the carriers move between the source region and the drain region by forming a tunnel path to connect the source region and the drain region, and $L_{OFF}$ denotes a drain offset length to regulate a length of the channel direction in the drain offset region, and in Inequality (5), $l_{t\_OFF}$ denotes a shortest tunnel distance over which the carriers move from the source region to the channel region through the tunnel junction surface in an OFF state of the tunnel field-effect transistor, and $T_{EPI}$ denotes a shortest distance between the bottom surface and the support surface.

6. A method for designing a tunnel field-effect transistor comprising: a semiconductor layer formed to include a source region, a channel region arranged adjacent to the source region and whose boundary surface with the source region is set as a tunnel junction surface to cause carriers in the source region to tunnel through, and a drain region arranged adjacent to the channel region and to which the carriers are transported from the channel region; a gate part formed with a gate insulating film and a gate electrode arranged in this order on the semiconductor layer; and an insulation part arranged to cover a side face of the gate electrode, and having: a structure in which part of the source region is arranged under a bottom surface of the gate part as a surface on a side of the gate insulating film to cause the bottom surface and the part of the source region to come into contact with each other; and a drain offset structure in which a drain offset region is formed in the semiconductor layer to keep the gate electrode and the drain region away from each other, wherein when a gate length as a width of the gate electrode in a direction parallel to a channel direction between the source region and the drain region is denoted by $L_G$, and an extension distance of the source region extended toward the drain region in a direction parallel to the channel direction from a position in the source region opposite in a height direction of the gate electrode to a source-side reference position as a side face position of the gate electrode closest to the source region is denoted by $L_{OV}$, the tunnel field-effect transistor is so designed that $L_{TG}$ expressed in Formula (1) below as a shortest distance between a position of an extension end of the source region, which is most extended toward the drain region based on a side face position of the gate electrode closest to the drain region and set as a drain-side reference position, and a position in the semiconductor layer opposite in the height direction of the gate electrode to the drain-side reference position satisfies respective conditions of Inequality (2) and Inequality (3) below,

[Math. 8]

$$L_{TG}=L_G-L_{OV} \qquad (1)$$

[Math. 9]

$$L_{TG}<l_{t\_OFF} \qquad (2)$$

[Math. 10]

$$L_{TG}>L_{direct}-L_{OFF} \qquad (3)$$

where $l_{t\_OFF}$ in Inequality (2) denotes a shortest tunnel distance over which the carriers move from the source region to the channel region through the tunnel junction surface in an OFF state of the tunnel field-effect transistor, and in Inequality (3), $L_{direct}$ denotes a shortest distance between the source region and the drain region to regulate a direct tunnel through which the carriers move between the source region and the drain region by forming a tunnel path to connect the source region and the drain region, and $L_{OFF}$ denotes a drain offset length to regulate a length of the channel direction in the drain offset region.

7. The method for designing the tunnel field-effect transistor according to claim 6, wherein $L_{TG}$ further satisfies a condition of Inequity (4) below,

[Math. 11]

$$L_{TG} > -T_{OX}\sqrt{\frac{4\epsilon_{SW}^2\beta^2}{\epsilon_{OX}^2} - 1} \tag{4}$$

where in Inequality (4), $T_{OX}$ denotes a thickness of the gate insulating film, $\epsilon_{OX}$ denotes a relative permittivity of a forming material of the gate insulating film, $\epsilon_{SW}$ denotes a relative permittivity of a forming material of the insulation part, and $\beta$ denotes an amplification factor of an electric field due to an electric field concentration at a position of the extension end of the source region.

8. A method for designing a tunnel field-effect transistor comprising: a semiconductor layer formed to include a source region, a channel region arranged adjacent to the source region and whose boundary surface with the source region is set as a tunnel junction surface to cause carriers in the source region to tunnel through, and a drain region arranged adjacent to the channel region and to which the carriers are transported from the channel region; a gate part formed with a gate insulating film and a gate electrode arranged in this order on the semiconductor layer; and an insulation part arranged to cover a side face of the gate electrode, and having: a structure in which part of the channel region and part of the source region with a support surface formed with respect to the part of the channel region as a surface parallel to a bottom surface of the gate part as a surface on a side of the gate insulating film are arranged in this order under the bottom surface to cause the part of the channel region to separate the bottom surface and the support surface from each other; and a drain offset structure in which a drain offset region is formed in the semiconductor layer to keep the gate electrode and the drain region away from each other, wherein when a gate length as a width of the gate electrode in a direction parallel to a channel direction between the source region and the drain region is denoted by $L_G$, and an extension distance of the source region extended toward the drain region in a direction parallel to the channel direction from a position in the source region opposite in a height direction of the gate electrode to a source-side reference position as a side face position of the gate electrode closest to the source region is denoted by $L_{OV}$, the tunnel field-effect transistor is so designed that $L_{TG}$ expressed in Formula (1) below as a shortest distance between a position of an extension end of the source region, which is most extended toward the drain region based on a side face position of the gate electrode closest to the drain region and set as a drain-side reference position, and a position in the semiconductor layer opposite in the height direction of the gate electrode to the drain-side reference position satisfies respective conditions of Inequality (3) and Inequality (5) below,

[Math. 12]

$$L_{TG} = L_G - L_{OV} \tag{1}$$

[Math. 13]

$$L_{TG} > L_{direct} - L_{OFF} \tag{3}$$

[Math. 14]

$$L_{TG} > \sqrt{l_{t\_OFF}^2 - T_{EPI}^2} \tag{5}$$

where in Inequality (3), $L_{direct}$ denotes a shortest distance between the source region and the drain region to regulate a direct tunnel through which the carriers move between the source region and the drain region by forming a tunnel path to connect the source region and the drain region, and $L_{OFF}$ denotes a drain offset length to regulate a length of the channel direction in the drain offset region, and in Inequality (5), $l_{t\_OFF}$ denotes a shortest tunnel distance over which the carriers move from the source region to the channel region through the tunnel junction surface in an OFF state of the tunnel field-effect transistor, and $T_{EPI}$ denotes a shortest distance between the bottom surface and the support surface.

* * * * *